US012727341B2

(12) United States Patent
Long et al.

(10) Patent No.: US 12,727,341 B2
(45) Date of Patent: Sep. 1, 2026

(54) DISPLAY PANEL WITH DARK DOT PROTECTION, FABRICATION METHOD THEREOF, AND ASSOCIATED DISPLAY APPARATUS

(71) Applicant: Honor Device Co., Ltd., Shenzhen (CN)

(72) Inventors: Haohui Long, Shenzhen (CN); Xiaolong Li, Shenzhen (CN); Shi Zhang, Shenzhen (CN); Jianping Fang, Shenzhen (CN); Shanshan Wei, Shenzhen (CN); Yingbo Zhao, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 390 days.

(21) Appl. No.: 18/037,138

(22) PCT Filed: Apr. 14, 2022

(86) PCT No.: PCT/CN2022/086732

§ 371 (c)(1),
(2) Date: May 16, 2023

(87) PCT Pub. No.: WO2022/218365

PCT Pub. Date: Oct. 20, 2022

(65) Prior Publication Data

US 2023/0422562 A1 Dec. 28, 2023

(30) Foreign Application Priority Data

Apr. 14, 2021 (CN) ........................ 202110401736.X

(51) Int. Cl.
*H10K 59/124* (2023.01)
*H10K 59/12* (2023.01)
*H10K 59/131* (2023.01)

(52) U.S. Cl.
CPC ....... *H10K 59/124* (2023.02); *H10K 59/1201* (2023.02); *H10K 59/131* (2023.02)

(58) Field of Classification Search
CPC . H10K 59/124; H10K 59/131; H10K 59/1201
(Continued)

(56) References Cited

U.S. PATENT DOCUMENTS 10,388,900 B2 8/2019 Seo et al.
10,454,054 B2 10/2019 Ishisone et al.
(Continued)

FOREIGN PATENT DOCUMENTS

CN 108520895 A 9/2018
CN 108550612 A 9/2018
(Continued)

*Primary Examiner* — Eric W Jones
(74) *Attorney, Agent, or Firm* — Slater Matsil, LLP

(57) ABSTRACT

This application provides a display panel, a fabrication method thereof, and a display apparatus. The display panel includes a display region and a non-display region extending around the display region, and includes: a base; an array structure layer, disposed on the base, where a drive circuit is disposed in the array structure layer, the array structure layer includes a first portion and a second portion, the first portion is a projection portion of the display region on the array structure layer, the second portion is a projection portion of the non-display region on the array structure layer, and the second portion is provided with a groove that is filled with a first organic material; an organic planarization layer, where the organic planarization layer covers the first portion and includes the first organic material; a light-emitting component layer, disposed on the organic planarization layer.

20 Claims, 12 Drawing Sheets

(58) Field of Classification Search
USPC ................................ 257/40, 59, 91, 99, 100
See application file for complete search history.

(56) References Cited

U.S. PATENT DOCUMENTS

| | | | | |
|---|---|---|---|---|
| 10,930,855 | B2 | 2/2021 | Takita et al. | |
| 11,107,995 | B2 | 8/2021 | Hara et al. | |
| 11,121,199 | B1 | 9/2021 | Chen | |
| 11,362,116 | B2 | 6/2022 | Wu | |
| 11,380,869 | B2 | 7/2022 | Yu et al. | |
| 2016/0351833 | A1 | 12/2016 | Hosoumi et al. | |
| 2020/0074901 | A1* | 3/2020 | Sohn | G09G 3/006 |
| 2020/0161398 | A1* | 5/2020 | Bang | H10K 59/8722 |
| 2021/0020718 | A1 | 1/2021 | Nishioka et al. | |
| 2021/0028393 | A1 | 1/2021 | Wang et al. | |
| 2021/0336205 | A1* | 10/2021 | Wang | H10K 59/8731 |
| 2021/0343984 | A1* | 11/2021 | Wang | H10K 59/124 |
| 2021/0366949 | A1* | 11/2021 | Wu | H10D 86/60 |
| 2022/0115473 | A1* | 4/2022 | Han | H10K 77/111 |
| 2022/0399419 | A1* | 12/2022 | Chen | H10K 59/122 |

FOREIGN PATENT DOCUMENTS

| | | | |
|---|---|---|---|
| CN | 108766979 | A | 11/2018 |
| CN | 109686867 | A | 4/2019 |
| CN | 109979973 | A | 7/2019 |
| CN | 110400891 | A | 11/2019 |
| CN | 111261642 | A | 6/2020 |
| CN | 111627926 | A | 9/2020 |
| CN | 113725380 | A | 11/2021 |
| JP | 2014241405 | A | 12/2014 |
| JP | 2016225619 | A | 12/2016 |
| JP | 2018002710 | A | 1/2018 |
| JP | 2018026552 | A | 2/2018 |
| WO | 2017103732 | A1 | 6/2017 |
| WO | 2018158659 | A1 | 9/2018 |
| WO | 2021031463 | A1 | 2/2021 |

* cited by examiner

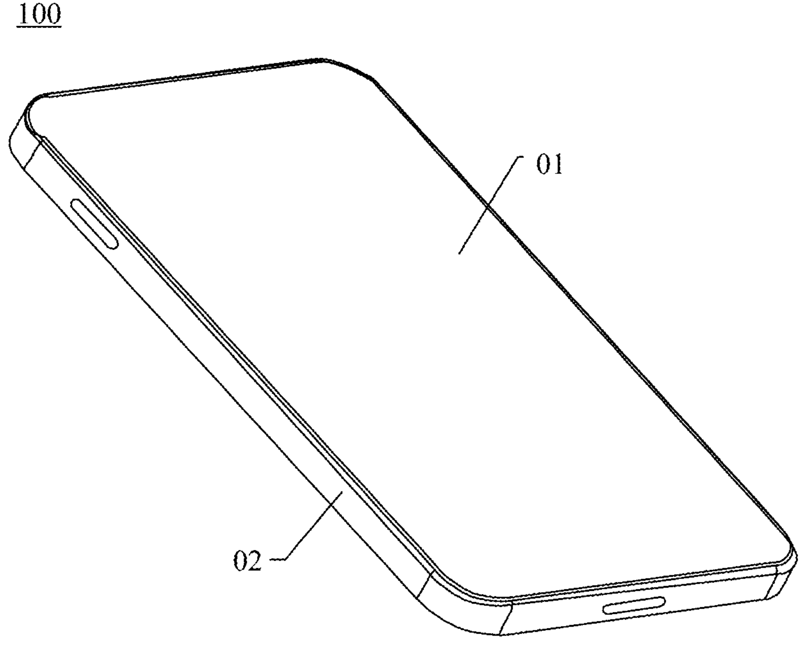
FIG. 1
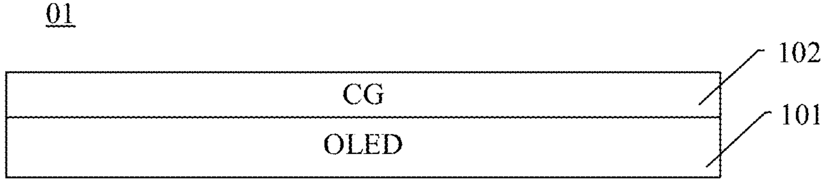
FIG. 2
1015 Cathode
1014 Electron transport layer
1013 Organic light-emitting layer
1012 Hole transport layer
1011 Anode
Electron
Electron hole
FIG. 3

DISPLAY PANEL WITH DARK DOT PROTECTION, FABRICATION METHOD THEREOF, AND ASSOCIATED DISPLAY APPARATUS

CROSS-REFERENCE TO RELATED APPLICATIONS

This application is a national stage of International Application No. PCT/CN2022/086732, filed on Apr. 14, 2022, which claims priority to Chinese Patent Application No. 202110401736.X, filed on Apr. 14, 2021. The disclosures of both of the aforementioned applications are hereby incorporated by reference in their entireties.

TECHNICAL FIELD

This application relates to the field of display technologies, and more specifically, to a display panel, a fabrication method thereof, and a display apparatus.

BACKGROUND

Organic light-emitting diode (organic light emitting diode, OLED) display panels are widely used in display apparatuses such as mobile phones, TVs, and tablet computers due to their advantages such as light weight, thinness, high brightness, fast response, great flexibility, and high luminous efficiency. However, OLEDs are sensitive to water vapor and oxygen. If a device is intruded by water vapor and oxygen because of poor packaging performance, the water vapor and oxygen that enter a display panel may exert an effect on an organic electroluminescent (electroluminescent, EL) material in the OLED device. As a result, the organic EL material changes and cannot emit light, that is, a dark dot problem occurs.

After some dark dots are formed, they grow larger gradually as time increases, and may eventually lead to a failure of the entire display panel. Such dark dots are also referred to as growing dark spots (growing dark spots, GDSs). GDSs are a chronic problem in the dark dot problem. Particularly, GDSs generated at edges of a display region of a display panel account for about 80% of dark dots of the display panel, which seriously affects a service life of the display panel.

SUMMARY

This application provides a display panel, a fabrication method thereof, and a display apparatus, so that a problem of dark dots on an edge of the display panel can be alleviated, and a service life of the display panel can be prolonged.

According to a first aspect, a display panel is provided. The display panel includes a display region and a non-display region extending around the display region, and includes: a base; an array structure layer, disposed on the base, where a drive circuit is disposed in the array structure layer, the array structure layer includes a first portion and a second portion, the first portion is a projection portion of the display region on the array structure layer, the second portion is a projection portion of the non-display region on the array structure layer, the second portion is provided with a groove, and the groove is filled with a first organic material; an organic planarization layer, where the organic planarization layer covers the first portion and includes the first organic material; a light-emitting component layer, disposed on the organic planarization layer, where the light-emitting component layer corresponds to the display region and is electrically connected to the drive circuit; and a packaging layer, where the packaging layer covers the light-emitting component layer and extends to the second portion.

In this embodiment of this application, "projection portion of the display region on the array structure layer" may be understood as a portion that is on the array structure layer and that corresponds to a projection region of the display region on the array structure layer, or as a portion corresponding to the display region; and "projection portion of the non-display region on the array structure layer" may be understood as a portion that is on the array structure layer and that corresponds to a projection region of the non-display region on the array structure layer, or as a portion corresponding to the non-display region.

In this embodiment of this application, the second portion of the array structure layer is provided with the groove, and the groove is filled with the first organic material, so that a problem of stress concentration caused by a relatively thick inorganic layer in this region can be effectively alleviated. When the display panel is bent or is struck by an external force, a region filled with the first organic material is unlikely to crack, so that intrusion of water and oxygen is unlikely to occur. This can avoid or reduce dark blocks or dark spots, alleviating a dark dot problem of an OLED display screen. In addition, a region having a relatively thick inorganic layer is filled with an organic material, so that a generated crack can be prevented from continuing to expand, which avoids or reduces dark blocks, or slows down growth of a dark block, and can also alleviate the dark dot problem of an OLED display screen. In addition, in this embodiment of this application, the groove is fabricated in the non-display region of the display panel and is filled with an existing organic film layer such as the organic planarization layer. The array structure layer can be filled with the organic material according to a simple fabrication process obtained by slightly changing an existing fabrication process of a display panel, thereby alleviating the dark dot problem.

With reference to the first aspect, in a possible implementation, the display panel further includes: a signal cable layer, disposed on the array structure layer, where the signal cable layer is provided with a signal cable on the second portion, and the groove corresponds to a position of the signal cable.

Generally, a relatively thick inorganic layer is superimposed under the signal cable in the non-display region. Therefore, a groove may be disposed in a film layer under the signal cable in the non-display region, and filled with the first organic material. This can alleviate stress concentration of the inorganic layer, prevent crack expansion, effectively alleviate the dark dot problem, and prolong a service life of the display panel.

With reference to the first aspect, in a possible implementation, the signal cable includes a voltage of source series VSS signal cable.

With reference to the first aspect, in a possible implementation, the groove partially or completely penetrates the array structure layer.

A depth of the groove is less than or equal to a thickness of the array structure layer. When the groove completely penetrates the array structure layer, the groove may be filled with the first organic material as much as possible, to alleviate a stress concentration problem of the second portion.

With reference to the first aspect, in a possible implementation, the second portion includes an insulation layer, a buffer layer, a gate insulation layer, and an inter-layer dielectric layer that are stacked in sequence, and all of the insulation layer, the buffer layer, the gate insulation layer, and the inter-layer dielectric layer are inorganic film layers.

With reference to the first aspect, in a possible implementation, the gate insulation layer includes a first gate insulation layer and a second gate insulation layer that are stacked, the organic planarization layer includes a first planarization layer and a second planarization layer, the first planarization layer includes the first organic material, the first portion of the array structure layer is provided with a thin-film transistor layer, and the thin-film transistor layer includes an active layer, a gate, and a source/drain, where the active layer is disposed between the buffer layer and the first gate insulation layer, and the first gate insulation layer coats the active layer and extends to the buffer layer; the gate is disposed between the first gate insulation layer and the second gate insulation layer, the second gate insulation layer coats the gate and extends to the first gate insulation layer, and the gate is disposed opposite the active layer; the source/drain includes a first source/drain portion and a second source/drain portion, where the first source/drain portion is disposed between the inter-layer dielectric layer and the first planarization layer, the first planarization layer coats the first source/drain portion, the first organic material of the first planarization layer is filled in the groove, and the first source/drain portion is connected to the active layer after sequentially penetrating the inter-layer dielectric layer, the second gate insulation layer, and the first gate insulation layer; the second source/drain portion is disposed between the first planarization layer and the second planarization layer, the second planarization layer coats the second source/drain portion and extends to the first planarization layer, and the second source/drain portion is connected to the first source/drain portion after penetrating the first planarization layer; and a first signal cable portion is disposed in a region, corresponding to the groove, of the inter-layer dielectric layer, where the first signal cable portion is a signal cable fabricated on the same layer as the second source/drain portion, and the first signal cable portion covers the first organic material filled in the groove and the inter-layer dielectric layer around the groove.

In this embodiment of this application, the groove is filled with the first planarization layer in a plurality of planarization layers according to a simple process.

With reference to the first aspect, in a possible implementation, the light-emitting component layer includes an anode, an organic light-emitting layer, and a cathode that are stacked, where the anode is disposed on the second planarization layer, and is connected to the second source/drain portion after penetrating the second planarization layer; a second signal cable portion is disposed on the first signal cable portion, is connected to the first signal cable portion, and is a signal cable fabricated on the same layer as the anode; and the cathode is disposed on the organic light-emitting layer, covers the organic light-emitting layer, and extends to the second signal cable portion.

With reference to the first aspect, in a possible implementation, the first signal cable portion and the second signal cable portion are part of the voltage of source series VSS signal cable.

With reference to the first aspect, in a possible implementation, a shape of a section of the groove in a thickness direction of the display panel is any one of the following shapes: a rectangle, a triangle, a trapezoid, a parallelogram, a polyline, a wave, an ellipse, an arc, or a stair; and/or, an extending direction of the groove in a plane where the display panel is located forms any of the following: a straight line, a curve, or a ring.

The shape of the section of the groove may be regular or irregular.

With reference to the first aspect, in a possible implementation, the groove extends along an edge of the first portion, and the groove includes consecutive trenches in the extending direction or intermittent trenches in the extending direction.

When there are consecutive grooves, a machining process of a mask plate used for fabricating the grooves is simple, and the grooves can be fabricated according to a process obtained by slightly changing an existing fabrication process of a display panel. The consecutive grooves may be filled with a relatively large quantity of organic materials, so that a problem of stress concentration on an edge of the array structure layer can be effectively alleviated.

The intermittent trenches enable the array structure layer to be filled with the organic material more uniformly.

With reference to the first aspect, in a possible implementation, an average width of the groove ranges from 15 microns to 25 microns.

An appropriate width of the groove enables the array structure layer to be filled with an appropriate quantity of organic materials, so that both a packaging performance requirement and a stress improvement capability requirement for the array structure layer can be met.

With reference to the first aspect, in a possible implementation, the groove includes a plurality of parallel trenches, and the plurality of trenches extend along the edge of the first portion, where a distance between two adjacent trenches in the plurality of trenches ranges from 20 microns to 25 microns.

An appropriate distance between grooves can meet both the packaging performance requirement and the stress improvement capability requirement for the array structure layer.

With reference to the first aspect, in a possible implementation, a width of a trench in the plurality of trenches that is close to the edge of the first portion is greater than or equal to a width of a trench in the plurality of trenches that is close to an edge of the display panel.

The trench close to the first portion has a relatively large width, so that the trench may be filled with a larger quantity of organic materials, which can effectively alleviate stress concentration in this region, and effectively prevent a crack from expanding to the first region and affecting display performance.

With reference to the first aspect, in a possible implementation, a shortest distance between the groove and the edge of the display panel ranges from 200 microns to 250 microns.

Since the inorganic layer of the second portion of the array structure layer is mainly used to complete packaging, that is, to prevent intrusion of water and oxygen, there is a sufficient distance between an outermost side of the groove and the edge of the display panel. Therefore, the inorganic layer on the edge of the array structure layer has a sufficient width to ensure packaging performance.

With reference to the first aspect, in a possible implementation, the base is made of a flexible material.

With reference to the first aspect, in a possible implementation, the base is made of a polyimide material.

With reference to the first aspect, in a possible implementation, the display panel is an organic light-emitting diode OLED display panel.

According to a second aspect, a display apparatus is provided, including the display panel in any one of the first aspect and the possible implementations of the first aspect.

According to a third aspect, an electronic device is provided, including the display panel in any one of the first aspect and the possible implementations of the first aspect.

According to a fourth aspect, a fabrication method of a display panel is provided. The display panel includes a display region and a non-display region extending around the display region. The fabrication method includes: providing a base; forming an array structure layer on the base, where a drive circuit is disposed in the array structure layer, the array structure layer includes a first portion and a second portion, the first portion is a projection portion of the display region on the array structure layer, and the second portion is a projection portion of the non-display region on the array structure layer; forming a groove in the second portion; forming an organic planarization layer on the array structure layer, where the organic planarization layer covers the first portion and further includes a first organic material, and the first organic material is filled in the groove; forming a light-emitting component layer on the organic planarization layer, where the light-emitting component layer corresponds to the display region and is electrically connected to the drive circuit; and forming a packaging layer on the light-emitting component layer, where the packaging layer covers the light-emitting component layer and extends to the second portion.

With reference to the fourth aspect, in a possible implementation, the fabrication method further includes: forming a signal cable layer on the array structure layer, where the signal cable layer is provided with a signal cable on the second portion, and the groove corresponds to a position of the signal cable.

With reference to the fourth aspect, in a possible implementation, the signal cable includes a voltage of source series VSS signal cable.

With reference to the fourth aspect, in a possible implementation, the forming an array structure layer on the base includes: sequentially forming an insulation layer, a buffer layer, an active layer, a gate insulation layer, a gate, and an inter-layer dielectric layer on the base, where the active layer and the gate are disposed on the first portion, the gate insulation layer coats the active layer and extends to the buffer layer, and the inter-layer dielectric layer coats the gate and extends to the gate insulation layer; and the forming a groove in the second portion includes: patterning the array structure layer to form a first hole in the first portion and form the groove in the second portion, where the first hole penetrates the inter-layer dielectric layer and the gate insulation layer and communicates with the active layer, and the groove partially or completely penetrates the inter-layer dielectric layer, the gate insulation layer, the buffer layer, and the insulation layer that are stacked in sequence.

With reference to the fourth aspect, in a possible implementation, the forming an organic planarization layer on the array structure layer includes: applying an organic film on the array structure layer, where the organic film covers the first portion and the second portion, and is filled in the groove; and patterning the organic film, to remove the organic film on the second portion of the array structure layer and retain the organic film filled in the groove.

With reference to the fourth aspect, in a possible implementation, the groove partially or completely penetrates the array structure layer.

With reference to the fourth aspect, in a possible implementation, the second portion includes an insulation layer, a buffer layer, a gate insulation layer, and an inter-layer dielectric layer that are formed and stacked in sequence, and all of the insulation layer, the buffer layer, the gate insulation layer, and the inter-layer dielectric layer are inorganic film layers.

With reference to the fourth aspect, in a possible implementation, a shape of a section of the groove in a thickness direction of the display panel is any one of the following shapes: a rectangle, a triangle, a trapezoid, a parallelogram, a polyline, a wave, an ellipse, an arc, or a stair; and/or, an extending direction of the groove in a plane where the display panel is located forms any of the following: a straight line, a curve, or a ring.

With reference to the fourth aspect, in a possible implementation, the groove extends along an edge of the first portion, and the groove includes consecutive trenches in the extending direction or intermittent trenches in the extending direction.

With reference to the fourth aspect, in a possible implementation, an average width of the groove ranges from 15 microns to 25 microns. With reference to the fourth aspect, in a possible implementation, the groove includes a plurality of parallel trenches, and the plurality of trenches extend along the edge of the first portion, where a distance between two adjacent trenches in the plurality of trenches ranges from 20 microns to 25 microns.

With reference to the fourth aspect, in a possible implementation, a width of a trench in the plurality of trenches that is close to the edge of the first portion is greater than or equal to a width of a trench in the plurality of trenches that is close to an edge of the display panel.

With reference to the fourth aspect, in a possible implementation, a shortest distance between the groove and the edge of the display panel ranges from 200 microns to 250 microns.

With reference to the fourth aspect, in a possible implementation, the base is made of a flexible material.

For a beneficial effect of the method in the fourth aspect, refer to a beneficial effect of the apparatus in the first aspect. Details are not described herein again.

BRIEF DESCRIPTION OF THE DRAWINGS

FIG. 1 is a schematic structural diagram of an electronic device;

FIG. 2 is a schematic structural diagram of a display module in the electronic device in FIG. 1;

FIG. 3 is a schematic diagram of a luminance principle of an OLED display panel;

FIG. 14 to FIG. 17 are schematic diagrams of a fabrication process of the display panel in FIG. 13;

Figure 4:
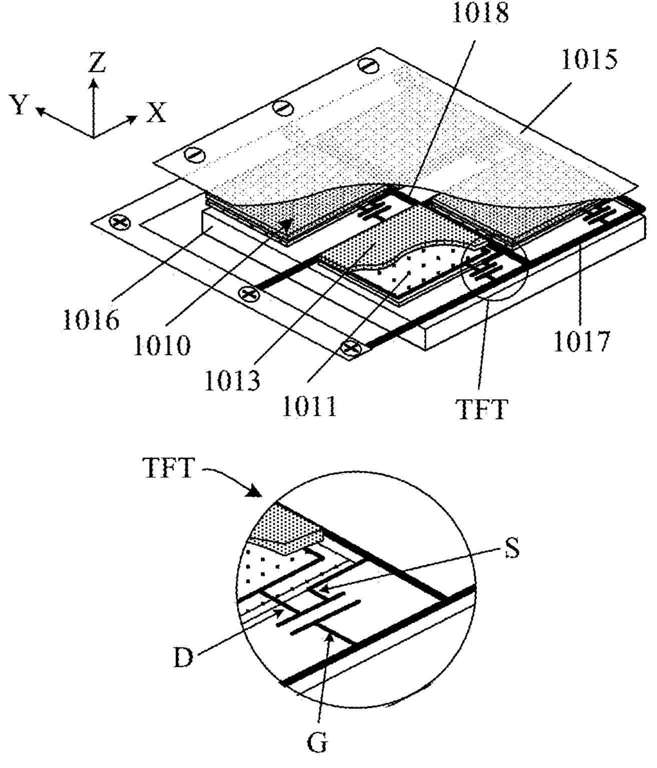
FIG. 4 is a schematic diagram of a driving principle of an OLED display panel.

Reference numerals in the accompanying drawings are as follows:

01: display module; 02: housing; 101: display panel; 1011: anode; 1012: hole transport layer; 1013: organic light-emitting layer; 1014: electron transport layer; 1015: cathode; 1016: base substrate; 1017: row electrode; 1018: column electrode; 1010: display unit; 102: cover plate; 103: crack; 11: base; 111: first substrate; 112: barrier; 113: second substrate; 12: array structure layer; 1201: drive circuit; 1202: groove; 1203: first hole; 1204: second hole; 1205: third hole; 1206: opening; 121: insulation layer; 122: buffer layer; 123: TFT layer; 1231: active layer; 1232: gate; 1233: first source/drain portion; 1234: second source/drain portion; 124: storage capacitor; 1241: first electrode; 1242: second electrode; 125: gate insulation layer; 1251: first gate insulation layer; 1252: second gate insulation layer; 126: inter-layer dielectric layer; 1261: first inter-layer dielectric layer; 1262: second inter-layer dielectric layer; 13: light-emitting component layer; 131: anode; 132: organic light-emitting layer; 133: cathode; 134: pixel spacer layer; 14: packaging layer; 144: dam; 145: trench; 15: filling layer; 16: organic planarization layer; 161: first planarization layer; 162: second planarization layer; 163: third planarization layer; 171: gate on array; 172: emission on array; 18: voltage of source series; 181: first signal cable portion; 182: second signal cable portion; 19: pixel definition layer; 141: first chemical vapor deposition layer; 142: ink jet printing layer; and 143: second chemical vapor deposition layer.

DETAILED DESCRIPTION OF ILLUSTRATIVE EMBODIMENTS

The following describes the technical solutions of this application with reference to the accompanying drawings. Apparently, the described embodiments are merely some rather than all of the embodiments of this application.

In the embodiments of this application, the terms such as “first” and “second” are merely used for description, but should not be understood as indicating or implying relative importance or implicitly specifying a quantity of indicated technical features. Therefore, a feature defined by “first”, “second”, or the like can explicitly or implicitly includes one or more of the features.

In the description of the embodiments of this application, orientations or positional relationships indicated by terms “upper”, “lower”, “inside”, “outside”, “perpendicular”, “horizontal”, and the like are defined relative to an orientation or a position in which a component is schematically placed in the accompanying drawings. It should be understood that these directional terms are relative concepts, are used for description and clarification, but are not intended to indicate or imply that the apparatuses or components mentioned must have specific orientations or be constructed and operated in a specific orientation, and may correspondingly change with the orientations in which the components are placed in the accompanying drawings. Therefore, these terms should not be construed as a limitation to this application.

It should be further noted that in the embodiments of this application, a same reference numeral indicates a same component or a same part. For a same part or component in the embodiments of this application, only one part or component may be used as an example in the figure to mark a reference numeral. It should be understood that, for another same part or component, the reference numeral is also applicable.

FIG. 1 shows a schematic structural diagram of an electronic device 100.

The electronic device in this embodiment of this application may include a handheld device, a vehicle-mounted device, a wearable device, a computing device, or another processing device connected to a wireless modem. The electronic device includes but is not limited to a cellular phone (cellular phone), a television (television), a smart phone (smart phone), a personal digital assistant (personal digital assistant, PDA) computer, a digital camera, a tablet computer, a portable computer, a laptop computer (laptop computer), a smart watch (smart watch), a smart wristband (smart wristband), an on-board computer, a desktop computer, a calculator, and another electronic device with a display function. The embodiments of this application do not impose special restrictions on a specific form of the electronic device. For ease of description and understanding, the following is described by using an example in which the electronic device is a terminal device, for example, a mobile phone.

It should be understood that FIG. 1 only schematically shows some components included in the electronic device 100. The components are not limited to shapes, sizes, and constructions shown in FIG. 1. In some other embodiments, the electronic device 100 may further include more or fewer components than those shown in the figure. This is not limited in this embodiment of this application. In some other embodiments, the electronic device 100 is of a different type, the electronic device 100 includes a different component. A structure of the electronic device in this embodiment of this application is only described for illustration.

Referring to FIG. 1, the electronic device 100 may include a display module 01 and a housing 02.

The housing 02 defines an accommodating space used for accommodating various components of the electronic device 100. The housing 02 may also play roles in protecting and supporting the electronic device 100.

The display module 01 is configured to display an image, disposed in the accommodating space defined by the housing 02, and connected to the housing 02.

As shown in FIG. 2, the display module 01 includes a display panel (display panel, DP) 101.

In this embodiment of this application, the display panel 101 is an organic light-emitting diode (organic light emitting diode, OLED) display panel. The OLED display panel can implement self-luminance, so that no backlight is required. The embodiments of this application mainly focus on scenarios where the display panel 101 is an OLED display panel, so that unless otherwise specified, the display panel in the following embodiments may be understood as an OLED display panel. Therefore, the OLED display panel may also be referred to as a display panel or a display screen for short in the following embodiments.

In some embodiments of this application, as shown in FIG. 2, the display module 01 further includes a cover plate 102 on a display side of the display panel 101, for example, cover glass (cover glass, CG). The cover glass has certain flexibility.

A schematic diagram of a self-luminance principle of the OLED display panel is shown in FIG. 3.

Generally, the OLED display panel may include an anode (anode) 1011, a hole transport layer 1012, an organic light-emitting layer 1013, an electron transport layer 1014, and a cathode (cathode) 1015. The organic light-emitting layer 1013 is located between the electron transport layer 1014 and the hole transport layer 1012. The cathode 1015 is disposed on a side, away from the organic light-emitting layer 1013, of the electron transport layer 1014. The anode 1011 is disposed on a side, away from the organic light-emitting layer 1013, of the hole transport layer 1012.

After a voltage is applied to the anode 1011, the cathode 1015 generates an electron, and the anode 1011 generates an electron hole. Under the action of an electric field force, the electron generated by the cathode 1015 and the electron hole generated by the anode 1011 move, respectively pass through the electron transport layer 1014 and the hole transport layer 1012, and migrate to the organic light-emitting layer 1013. Since the electron hole and the electron respectively carry a positive charge and a negative charge, when they meet on the organic light-emitting layer 1013, an organic material is excited to emit light. If the anode 1011 is made of a transparent material such as indium tin oxide (indium tin oxide, ITO), light emitted by the organic light-emitting layer 1013 is emitted from a side close to the anode 1011. Such structure may also be referred to as a bottom emitting structure. If the cathode 1015 is made of a transparent material, light emitted by the organic light-emitting layer 1013 is emitted from a side close to the cathode 1015. Such structure may also be referred to as a top emitting structure. Luminance of the OLED display panel can be adjusted by controlling a magnitude of a voltage or current.

The display panel 101 includes many tiny display units. Each display unit is driven by a thin-film transistor (thin film transistor, TFT) integrated in the back of the display unit, thereby implementing point-to-point independent control of each display unit. As shown in FIG. 4, display units 1010 are arranged in an array on a base substrate 1016 of the display panel; and a row electrode 1017 and a column electrode 1018 that are insulated from and perpendicular to each other are disposed between the display units 1010. A thin-film transistor TFT is fabricated near an intersection point of the row electrode 1017 and the column electrode 1018.

From a top view, the row electrode 1017 is generally arranged horizontally (for example, in an X direction in the figure) and is used to control a row of display units to be on/off, that is, to control TFTs to be on/off. A scanning voltage is applied to the row electrode 1017. In some embodiments, the row electrode 1017 may also be referred to as a scan line (scan line), a gate line, a scan electrode, an X electrode, or the like. The column electrode 1018 is generally arranged longitudinally (for example, in a Y direction in the figure) and is used to transmit a voltage to the display unit 1010. The voltage is used to drive the display unit 1010 to emit light. Specifically, a data voltage is applied to the column electrode 1018. The data voltage cooperates with a voltage applied to the cathode 1015, thereby making the organic light-emitting layer 1013 emit light. In some embodiments, the column electrode 1018 may also be referred to as a data line (data line), a signal line, a signal electrode, a Y electrode, or the like.

The thin-film transistor TFT may actively control each independent display unit 1010 on a screen and is a switch for turning on/off each display unit 1010 on the display screen. Specifically, the TFT is a three-terminal switching transistor, including a gate (gate, G), a source (source, S), and a drain (drain, D). Referring to FIG. 4, the gate G of the TFT is connected to the horizontal row electrode 1017, the source S is connected to the longitudinal column electrode 1018, and the drain D is connected to the anode 1011. When there is no voltage on the gate G, no current flows between the source S and the drain D. In this case, the TFT is in an off state, and display of the display unit 1010 cannot be adjusted. When a sufficient voltage is applied to the row electrode 1017, the TFT electrically connected to the row electrode 1017 is turned on, and the data voltage on the column electrode 1018 can control luminance of the display unit 1010 to achieve a display effect. In other words, when electrical signals are simultaneously applied to the row electrode 1017 and the column electrode 1018 where the display unit 1010 is located, a TFT corresponding to the display unit 1010 is turned on, and the display unit 1010 is gated. Times for turning on and turning off the TFT are controlled by the row electrode 1017.

It should be understood that a structure and a drive circuit of an OLED display panel shown in FIG. 4 are only exemplary, are only used to briefly introduce a basic structure and a working principle of the OLED display panel, and should not be understood as limitations to the embodiments of this application. In some other embodiments, the OLED display panel may also use a panel structure and a drive circuit that are of other forms. This is not limited in this embodiment of this application.

The display unit 1010 may be fabricated by using independent light-emitting materials to obtain three primary colors of red (red, R), green (green, G), and blue (blue, B), thereby achieving colorization. For example, if a display unit 1010 is made of a light-emitting material capable of emitting red light, the display unit 1010 can emit red light; and if the display unit 1010 is made of a light-emitting material capable of emitting green light, the display unit 1010 can emit green light. Certainly, the three primary colors may also be obtained by using a color filter film, that is, each display unit 1010 emits white light, and the three primary colors of R, G, and B may be obtained after the white light passes through the color filter film. The three primary colors R, G, and B have different gray-scale changes. A display unit including display of three neighboring primary colors R, G, and B may be considered as a basic unit of display, namely, a pixel (pixel). Correspondingly, the display unit 1010 may also be referred to as a pixel unit, a pixel point, a sub-pixel, or the like. Pixels can mix the three primary colors in different intensity ratios to present different color changes.

Figure 5:
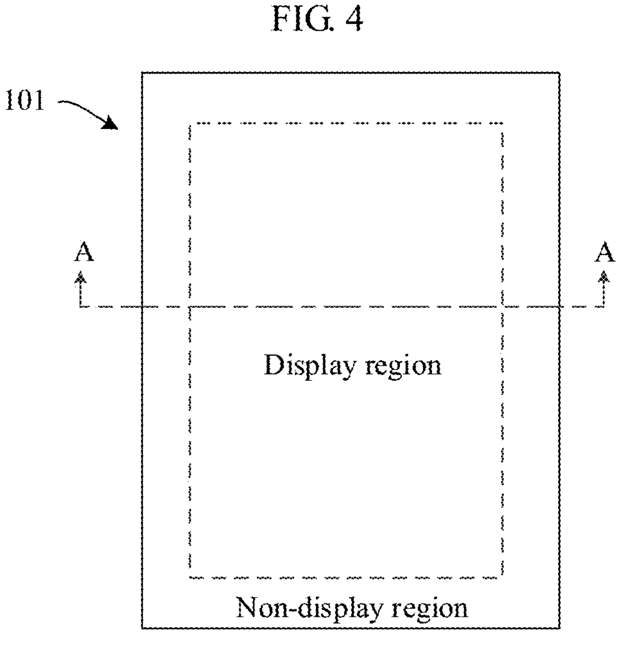
FIG. 5 is a schematic top view of an OLED display panel.

The display panel 101 is provided with drive circuits that are arranged in an array. A display unit is disposed on part of a region above the drive circuits. Therefore, the display panel 101 generally does not have a complete light-emitting side. FIG. 5 shows a schematic top view of an OLED display panel. As shown in FIG. 5, the display panel 101 includes a display region and a non-display region extending around the display region. The display region is provided with a display unit, a pixel circuit used for driving the display unit to emit light, and the like. The display region is used for displaying an image. The non-display region is not provided with any display units, and is generally provided with a drive circuit of a gate on array (gate on array, GOA), and the like.

At present, most OLED display screens have a dark dot problem, that is, a display region of the display screen is incapable of normally displaying an image due to a dark spot or dark block. This is because most materials of OLED devices are extremely sensitive to water vapor and oxygen. If a device is intruded by water vapor and oxygen because of poor packaging performance, the water vapor and oxygen that enter a display screen may exert an effect on an organic electroluminescent (electroluminescent, EL) material in a display region. As a result, the organic EL material changes and cannot emit light.

After some dark dots are formed, they grow larger gradually as time increases, and may eventually lead to a failure of the entire display panel. Such dark dots are also referred to as growing dark spots (grow dark spots, GDSs). GDSs are a chronic problem in the dark dot problem. Particularly, GDSs generated at edges of a display region account for about 80% of dark dots of the display screen.

Therefore, this embodiment of this application provides an OLED display panel, to obviously alleviate the dark dot problem.

Figure 6:
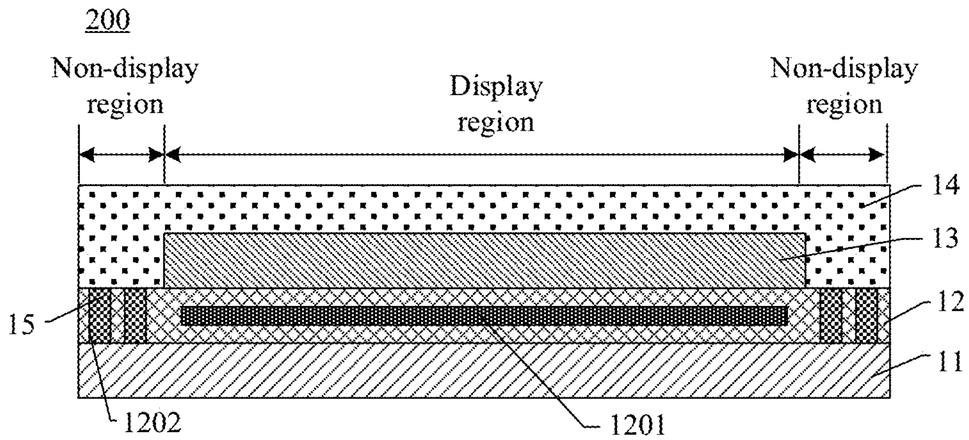
FIG. 6 is a schematic sectional view of a display panel according to an embodiment of this application.

FIG. 6 shows a schematic sectional view of an OLED display panel according to an embodiment of this application. FIG. 6 may be a schematic sectional view along a line A-A of the display panel in FIG. 5.

As shown in FIG. 6, the display panel 200 includes a base 11, an array structure layer 12, a light-emitting component layer 13, a packaging layer 14, and a filling layer 15.

The base 11 is a matrix for forming another film layer and mainly plays roles in supporting and sealed packaging.

The base 11 may be made of a flexible material, for example, a flexible resin material, a flexible plastic material, or ultra-thin metal. In this case, the display panel 200 is a flexible display panel or referred to as a flexible display screen.

Alternatively, the base 11 may be made of a relatively hard material, for example, glass. In this case, the display panel 200 is a hard display panel or referred to as a hard display screen.

The array structure layer 12 is disposed on the base 11 and is configured to form a drive circuit 1201, thereby driving the light-emitting component layer 13 to emit light. In other words, the drive circuit 1201 is disposed in the array structure layer 12. It should be understood that a position and a form of the drive circuit 1201 in FIG. 6 are merely exemplary and do not form any restriction on a specific structure, form, and position of the drive circuit.

The light-emitting component layer 13 is disposed on the array structure layer 12 and is configured to form a display unit for displaying an image. The light-emitting component layer 13 corresponds to the display region of the display panel and is electrically connected to the drive circuit 1201 in the array structure layer. It may be understood that all regions that are of the light-emitting component layer 13 and that can emit light are the display region of the display panel.

The array structure layer 12 includes a first portion corresponding to the display region of the display panel and a second portion corresponding to the non-display region of the display panel. The first portion corresponding to the display region is a portion, corresponding to the light-emitting component layer 13, of the array structure layer 12. The second portion corresponding to the non-display region is another portion, other than the portion corresponding to the light-emitting component layer 13, of the array structure layer 12.

In this embodiment of this application, that the first portion corresponds to the display region may be understood as follows: The first portion is a projection portion of the display region on the array structure layer 12. Specifically, the first portion is a portion, corresponding to a projection region of the display region on the array structure layer, of the array structure layer 12. That the second portion corresponds to the non-display region may be understood as follows: The second portion is a projection portion of the non-display region on the array structure layer 12. Specifically, the second portion is a portion, corresponding to a projection region of the non-display region on the array structure layer, of the array structure layer 12. Herein, projections of the display region and the non-display region on the array structure layer 12 may be understood as projections of the display region and the non-display region in a thickness direction of the display panel.

The drive circuit 1201 includes a thin-film transistor TFT layer that is disposed on the first portion, corresponding to the display region, of the array structure layer 12. The TFT layer includes a plurality of thin-film transistors. Each of the plurality of thin-film transistors is configured to control, to be on/off, a display unit that is on the light-emitting component layer 13 and that corresponds to the thin-film transistor.

A second portion, corresponding to the non-display region, of the array structure layer 12 is provided with a groove 1202. The filling layer 15 is disposed in the groove 1202. The filling layer 15 is an organic material, for example, polyimide, polytetrafluoroethylene, acrylic resin, polyethylene, polyvinyl chloride, polypropylene, phenolic resin, epoxy resin, polybutadiene, polyisoprene, chloroprene rubber, butyl rubber, or the like. In other words, the groove 1202 is filled with the organic material, and the organic material in the groove 1202 forms the filling layer 15.

The packaging layer 14 is disposed on the light-emitting component layer 13, covers the light-emitting component layer 13, and extends to the second portion of the array structure layer 12. A region, covering the light-emitting component layer 13, of the packaging layer 14 corresponds to the display region of the display panel. A region, covering the array structure layer 12, of the packaging layer 14 corresponds to the non-display region of the display panel. The packaging layer 14 mainly plays a role in packaging to prevent intrusion of water and oxygen. In this embodiment of this application, the packaging layer 14 may be fabricated by using a thin-film encapsulation (thin-film encapsulation, TFE) process, so that the packaging layer 14 may also be referred to as a thin-film packaging layer.

In this embodiment of this application, a film layer (such as the array structure layer 12) between the base 11 and the light-emitting component layer 13 may also be referred to as a backplane (backplane, BP) layer. In a fabrication process, a process of forming the backplane layer may be referred to as a backplane process. The backplane process is to superimpose film layers of different patterns and different materials through film formation, exposure, etching, and the like to form the drive circuit 1201, thereby providing a light-emitting component with a lighting signal and power input.

Figure 7:
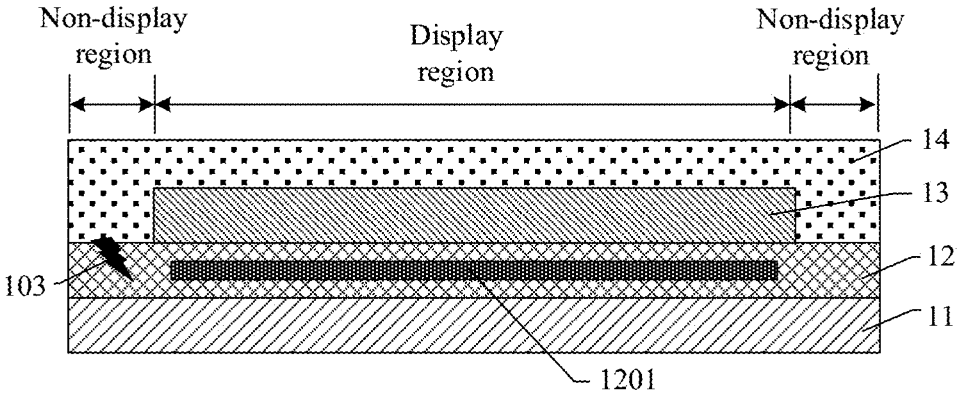
FIG. 7 is a schematic diagram of a dark dot problem of an OLED display panel.

FIG. 7 shows a schematic diagram of a dark dot problem of an OLED display panel, where the second portion of the array structure layer 12 is not provided with the groove 1202 and the filling layer 15 that are shown in FIG. 6. The following describes, with reference to FIG. 7, how the OLED display panel provided by the embodiments of this application alleviates the dark dot problem.

By performing focused ion beam (focused ion beam, FIB) slicing on the OLED display panel shown in FIG. 7, it is found that there is a crack 103 near a GDS generated on an edge of the display region. The crack 103 is perpendicular to an edge of the display panel, and the crack spreads from the array structure layer 12 in the thickness direction of the display panel. For details, refer to FIG. 7. By analyzing a position of the crack, it is found that on the position where the crack 103 is generated, a relatively thick inorganic layer is superimposed, so that an elastic modulus is relatively high, and stress is relatively concentrated. Therefore, when the display screen is bent or struck by an external force, this position is apt to crack. As a result, intrusion of water and oxygen is caused, and a dark dot is generated.

In other words, the second portion of the array structure layer 12 has a relatively thick inorganic layer (which may be referred to as a BP inorganic layer in the embodiments of this application); and when the display screen is struck or bent, the BP inorganic layer is easy to crack, causing a dark dot problem. However, in the display panel provided in this embodiment of this application, the second portion of the array structure layer 12 is provided with the groove, and the groove is filled with the organic material, so that a problem of stress concentration caused by a relatively thick inorganic layer in this region can be effectively alleviated. When the display panel is bent or is struck by an external force, a region filled with the organic material is unlikely to crack, so that intrusion of water and oxygen is unlikely to occur. This can avoid or reduce dark blocks or dark spots, thereby alleviating a dark dot problem of an OLED display screen. In addition, a region having a relatively thick inorganic layer is filled with an organic material, so that a generated crack can be prevented from continuing to expand, which avoids or reduces dark blocks, or slows down growth of a dark block, and can also alleviate the dark dot problem of an OLED display screen.

It should be understood that a structure of the display panel 200 shown in this embodiment of this application is merely exemplary. In some other embodiments, the display panel 200 may have a more specific film layer stacking manner. Detailed examples are given below with reference to the accompanying drawings. Details are not described herein.

Referring back to FIG. 6, the groove 1202 in the array structure layer 12 may have various shapes, and may be designed accordingly as required in practical application.

Figure 8:
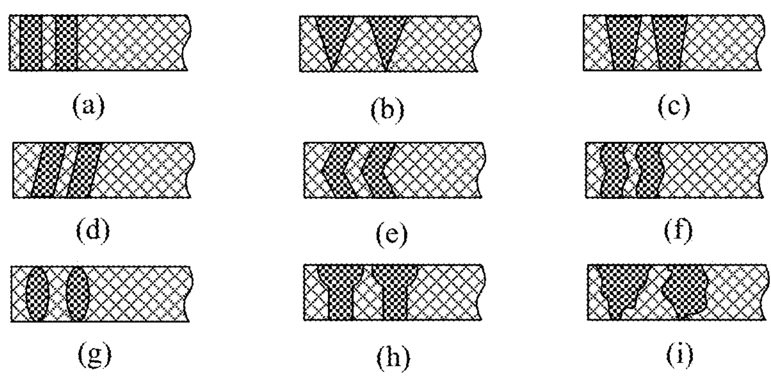
FIG. 8 is a schematic sectional view of a groove in FIG. 6.

FIG. 8 shows a schematic sectional view of a groove in FIG. 6, namely, a schematic diagram of a shape of a section that is of the groove and that is in a plane where the thickness direction of the display panel is located.

For example, as shown in FIG. 8, the shape of the section of the groove 1202 may be a rectangle (as shown in (a) of FIG. 8), a triangle (as shown in (b) of FIG. 8), a trapezoid (as shown in (c) of FIG. 8), a parallelogram (as shown in (d) of FIG. 8), a polyline (as shown in (e) of FIG. 8), a wave (as shown in (f) of FIG. 8), an ellipse (as shown in (g) of FIG. 8), a flashlight (as shown in (h) of FIG. 8), a stair, an arc, another regular shape or irregular shape (as shown in (i) of FIG. 8), or the like.

Figure 9:
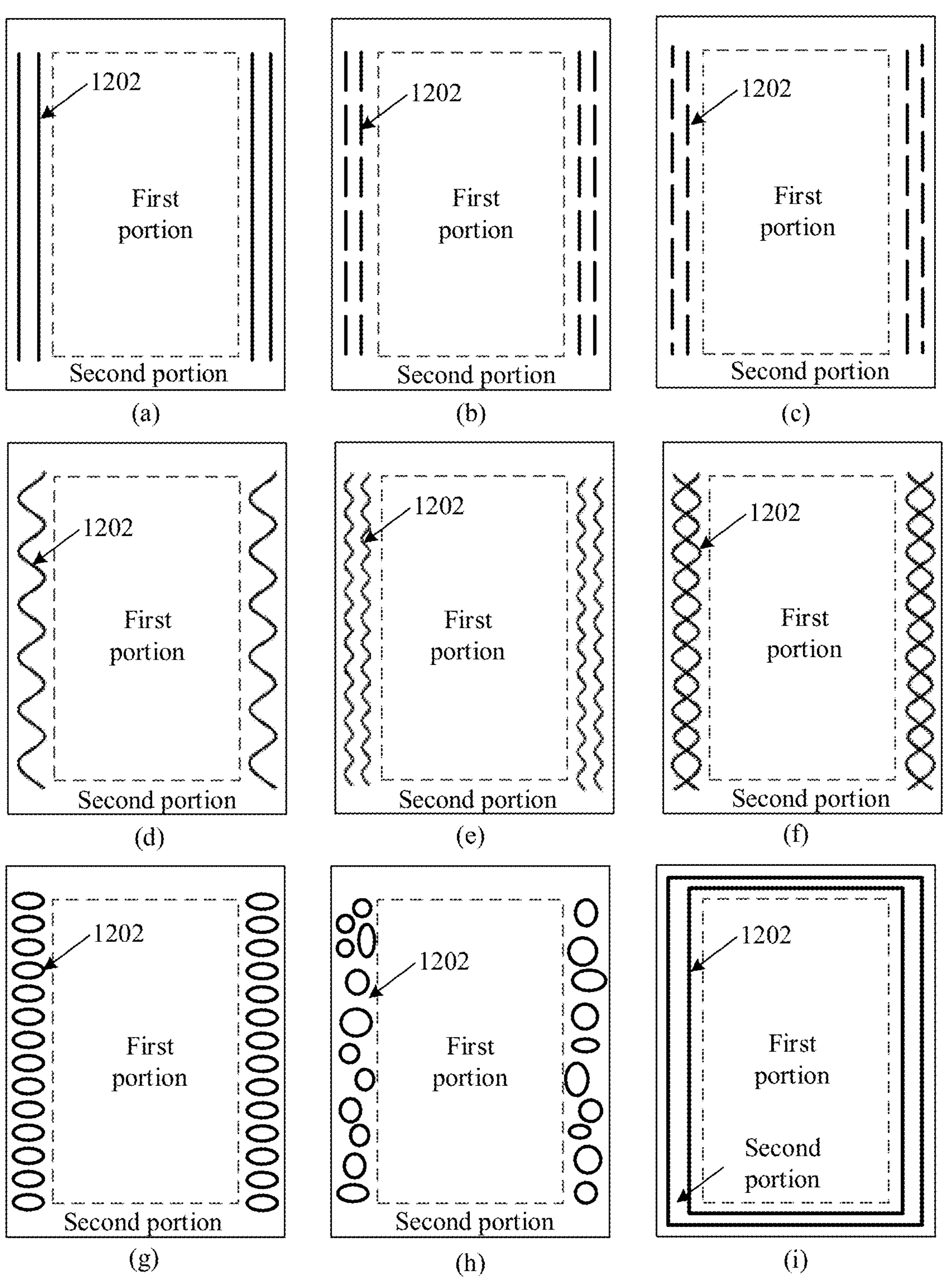
FIG. 9 is a schematic top view of a groove in FIG. 6.

FIG. 9 shows a schematic top view of a groove in FIG. 6, namely, a schematic diagram of a shape that is of the groove and that is in a plane where the display panel is located.

For example, as shown in FIG. 9, the shape that is of the groove 1202 and that is in the plane where the display panel is located may be a straight line (as shown in (a), (b), and (c) of FIG. 9), a curve (as shown in (d), (e), and (f) of FIG. 9), a ring (as shown in (g), (h), and (i) of FIG. 9), another regular shape or irregular shape, or the like. It should be understood that the shape that is of the groove and that is in the plane where the display panel is located in this embodiment of this application may be understood as an extending trend or extending direction of the groove in the plane. The shape of the section that is of the groove and that is in the plane where the thickness direction of the display panel is located is not limited herein. For example, the shape of the section of the groove may be any of the shapes shown in FIG. 8.

As an example, the shape that is of the groove 1202 and that is in the plane where the display panel is located is a straight line. This may also be understood as that the groove 1202 extends in the plane along the straight line.

For example, a bold line in the second portion of the array structure layer shown in (a) of FIG. 9 is a schematic diagram of the extending direction of the groove 1202. Assuming that the display region of the display panel is a rectangle, and the first portion of the array structure layer is also a rectangle correspondingly, in a length direction of the rectangle, the groove 1202 may be a long groove whose length is approximately equal to that of the first portion. In other words, the groove 1202 extends in a length direction of the first portion, and extends from one end to the other end of the first portion in the length direction. Alternatively, in other words, the groove 1202 is a solid-line groove in the length direction of the first portion. In a width direction of the rectangle (not shown in the figure), the groove 1202 may be a long groove whose width is approximately equal to that of the first portion; or the groove 1202 may be a solid-line groove in a width direction of the first portion. In other words, the groove 1202 may also be a solid-line groove extending in an edge direction of the first portion.

In other words, the groove 1202 may extend along an edge of the first portion of the array structure layer, where the groove 1202 is a continuous groove in the extending direction.

In some embodiments, the second portion of the array structure layer may be provided with one or more solid-line grooves. When a plurality of solid-line grooves are provided, the plurality of solid-line grooves may be arranged in parallel or crosswise.

A shape of the solid-line grooves is simple, and a machining process of a mask plate used for fabricating the solid-line grooves is simple, so that the grooves can be obtained according to a process obtained by slightly changing an existing fabrication process of a display panel to pattern the array structure layer; and the grooves are filled with the organic material. In addition, the length of the groove 1202 is approximately equal to that of the first portion, so that the array structure layer may be filled with a relatively large quantity of organic materials, thereby effectively alleviating a problem of stress concentration on an edge of the array structure layer.

For another example, a bold line in the second portion shown in (b) and (c) of FIG. 9 is a schematic diagram of the groove 1202. A difference from (a) of FIG. 9 lies in that herein, the groove 1202 includes a plurality of sub-grooves in the edge direction of the first portion (for example, the length direction or width direction of the first portion), and a tail of a sub-groove is adjacent to but does not communicate with a head of a next sub-groove. In other words, the groove 1202 is a dashed-line groove extending in the edge direction of the first portion. Alternatively, it may be understood that the groove 1202 may extend along an edge of the first portion of the array structure layer. The groove 1202 is a groove that is intermittent in the extending direction, and may also be referred to as an intermittent groove.

Due to arrangement of the dashed-line groove, the array structure layer can be filled with the organic material uniformly, so that a problem of stress concentration on an edge of the array structure layer can be effectively alleviated.

In some embodiments, the second portion of the array structure layer may be provided with one or more dashed-line grooves. When a plurality of dashed-line grooves are provided, the plurality of dashed-line grooves may be arranged in parallel. Herein, one of two adjacent dashed-line grooves is referred to as a first dashed-line groove, and the other one is referred to as a second dashed-line groove. In this embodiment of this application, projections, in a direction perpendicular to an edge of the first portion, of a plurality of sub-grooves included in the first dashed-line groove and a plurality of sub-grooves included in the second dashed-line groove may completely overlap, for example, as shown in (b) of FIG. 9. Alternatively, the projections, in the direction perpendicular to the edge of the first portion, of the plurality of sub-grooves included in the first dashed-line groove and the plurality of sub-grooves included in the second dashed-line groove may partially overlap, that is, the plurality of sub-grooves included in the first dashed-line groove and the plurality of sub-grooves included in the second dashed-line groove are arranged alternately in the direction perpendicular to the edge of the first portion, for example, as shown in (c) of FIG. 9.

Similarly, when a plurality of dashed-line grooves are provided, the plurality of dashed-line grooves may be arranged crosswise. The sub-grooves included in the first dashed-line groove may not communicate with the sub-grooves included in the second dashed-line groove; or a first sub-groove in the first dashed-line groove communicates with a second sub-groove in the second dashed-line groove. This is not limited in this embodiment of this application.

Due to crosswise arrangement of the sub-grooves in the dashed-line grooves, the array structure layer can be filled with the organic material more uniformly, so that a problem of stress concentration on an edge of the array structure layer can be effectively alleviated.

As another example, the shape that is of the groove 1202 and that is in the plane where the display panel is located is a curve. This may also be understood as that the groove extends in the plane along the curve.

For example, a bold line in the second portion shown in each of (d) to (f) of FIG. 9 is a schematic diagram of the groove 1202. The groove 1202 extends in the edge direction of the first portion. The groove 1202 may be a continuous curved groove (similar to the solid-line groove) or an intermittent curved groove (similar to the dashed-line groove) in the extending direction.

In some embodiments, the second portion of the array structure layer may be provided with one or more curved grooves.

When one curved groove is provided, for example, a groove shown in (d) of FIG. 9, in the direction perpendicular to the edge of the first portion, a distance between a point (hereinafter referred to as a farthest point) that is on the curved groove and that is farthest from the edge of the first portion and a point (hereinafter referred to as a closest point) that is on the curved groove and that is closest to the edge of the first portion may be slightly smaller than a width of the second portion in this direction. For example, the distance between the farthest point and the closest point on the curved groove is less than or equal to 80% of the width of the second portion in this direction. Herein, the edge of the first portion is an outer edge of the first portion, namely, an edge of the display panel.

When a plurality of curved grooves are provided, the plurality of curved grooves may be arranged in parallel, for example, as shown in (e) of FIG. 9. It should be understood that parallel arrangement of the curved grooves herein may be understood as follows: In the direction perpendicular to the edge of the first portion, tangents of positions that correspond to every two curved grooves and that are in a same direction are parallel to each other.

When a plurality of curved grooves are provided, the plurality of curved grooves may be arranged crosswise, for example, as shown in (f) of FIG. 9. Herein, one of two crosswise curved grooves is referred to as a first curved groove, and the other one is referred to as a second curved groove. The first curved groove and the second curved groove communicate at an intersection point, and do not communicate at a non-intersection point. The first curved groove and the second curved groove look like a fried dough twist as a whole. Certainly, in some embodiments, the first curved groove and the second curved groove may also be considered as two groove portions of one curved groove. This is not limited in this embodiment of this application.

An extension form of the curved groove may be a wave, for example, a sine wave or a cosine wave.

Due to arrangement of the curved groove in the array structure layer, the array structure layer can be filled with a relatively large quantity of organic materials, so that a problem of stress concentration on an edge of the array structure layer can be effectively alleviated. The curved groove is also relatively easy to machine, so that costs are relatively low.

As still another example, the shape that is of the groove 1202 and that is in the plane where the display panel is located is a ring. This may also be understood as that a head and an end of the groove 1202 are connected to or communicate with each other as a ring.

In some embodiments, the ring-shaped groove may be a circular ring-shaped groove, an elliptical ring-shaped groove, a square ring-shaped groove, a ring-shaped groove of another regular or irregular shape, or the like.

In some embodiments, the second portion of the array structure layer may be provided with a plurality of ring-shaped grooves. The plurality of ring-shaped grooves may be arranged on the array structure layer in the edge direction of the first portion regularly, for example, as shown in (g) of FIG. 9; or the grooves may be arranged irregularly, for example, as shown in (h) of FIG. 9. This is not limited in this embodiment of this application. Shapes of the plurality of ring-shaped grooves may be the same or different.

In some embodiments, the ring-shaped groove may extend in the edge direction of the first portion, for example, as shown in (i) of FIG. 9.

As yet another example, the groove may include a plurality of dents that are formed in the array structure layer and that do not communicate with each other. The plurality of dents may be arranged regularly or irregularly. This is not limited in this embodiment of this application.

As mentioned above, the non-display region of the display screen is disposed around the display region. Correspondingly, the second portion of the array structure layer surrounds the first portion of the array structure layer. The groove may be disposed in some or all regions of the second portion.

For example, the display screen is a rectangle. In this case, the groove may be disposed in a region that is of the second portion and that is on a length side of the rectangle, for example, as shown in (a) to (h) of FIG. 9. Generally, when the display screen is struck by an external force, a portion that is of the array structure layer and that is on the length side is more prone to crack. Alternatively, for a foldable display screen, the array structure layer has a bending deformation on the length side, thereby being prone to crack.

The groove is disposed in a portion that cracks frequently, and is filled with the organic material, so that stress concentration of this portion can be effectively alleviated, and cracks can be reduced or avoided. Therefore, a dark dot problem is alleviated.

Certainly, the groove may alternatively be disposed around the first portion, for example, as shown in (i) of FIG. 9. In this way, all portions that are of the array structure layer and that have a relatively thick inorganic layer are filled with the organic material, thereby better alleviating a dark dot problem.

It should be noted that shapes and arrangements of the first portion and the second portion in FIG. 9 are merely exemplary. In practical application, for different electronic devices, the first portion and the second portion may have different arrangements. This is not limited in this embodiment of this application. In addition, a shape, a position, and the like of the groove in FIG. 9 are merely exemplary. Those skilled in the art may design the groove according to actual needs. This is not particularly limited in this embodiment of this application.

With reference to FIG. 8 and FIG. 9, the above describes the shape of the groove from two aspects separately: the shape of the section of the groove and the extending trend of the groove in the second portion. If the shape of the groove is described from a three-dimensional perspective, the features in the foregoing two aspects may be included. For example, the groove 1202 shown in FIG. 6 may be a rectangular straight groove, a trapezoidal straight groove, a rectangular curved groove, a trapezoidal curved groove, a rectangular ring-shaped groove, a trapezoidal ring-shaped groove, or the like, which are merely described herein for illustration and are not listed one by one.

In this embodiment of this application, a width of a groove and an interval between grooves may be designed according to actual needs.

Using a section of the groove shown in FIG. 8 as an example, a width of the groove may range from 15 microns (μm) to 25 microns (μm). For example, the width of the groove may be 15 μm, 18 μm, 20 μm, 23 μm, 25 μm, or the like. An appropriate width of the groove enables the array structure layer to be filled with an appropriate quantity of organic materials, so that both a packaging performance requirement and a stress improvement capability requirement for the array structure layer can be met.

It should be noted that the groove may have equal or unequal widths in a depth direction. For a groove having equal widths, the widths are uniform in the depth direction. For a groove having unequal widths, the widths are different in the depth direction. In practical application, an average width of the groove in the depth direction may be considered as the width of the groove, or a maximum width of the groove in the depth direction may be considered as the width of the groove. This depends on the shape of the groove. For a case in which the groove is a dent, in practical application, an average value of radial dimensions of the groove may be considered as the width of the groove.

For example, a top view of a groove shown in FIG. 9 is used as an example, and an interval between grooves may range from 20 μm to 25 μm. For example, the interval between the grooves may be 20 μm, 22 μm, 23 μm, 25 μm, or the like. It should be noted that an interval between grooves in the embodiments of this application may be understood as a shortest distance between two adjacent grooves.

In some embodiments, the groove may include a plurality of parallel trenches. The plurality of trenches extend along the edge of the first portion. A distance between two adjacent trenches in the plurality of trenches ranges from 20 microns to 25 microns. An appropriate distance between grooves can meet both the packaging performance requirement and the stress improvement capability requirement for the array structure layer.

In some embodiments, a width of a trench in the plurality of trenches that is close to the edge of the first portion is greater than or equal to a width of a trench in the plurality of trenches that is close to an edge of the display panel.

The following describes an arrangement of the plurality of solid-line grooves by using an example in which the second portion of the array structure layer is provided with a plurality of parallel solid-line grooves and the plurality of solid-line grooves extend in the edge direction of the first portion, for example, as shown in (a) of FIG. 9.

Figure 10:
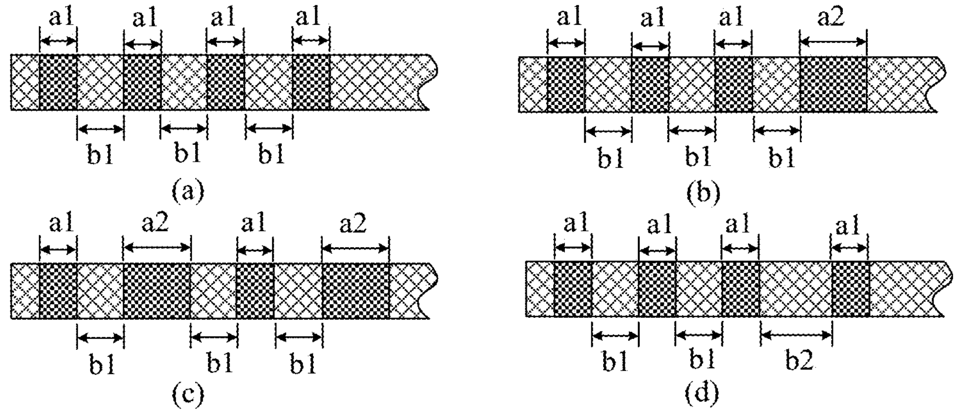
FIG. 10 is a schematic sectional view of a groove in FIG. 6.

Referring to (a) of FIG. 10, widths of the plurality of solid-line grooves may have a same value, for example, a1. Intervals between any two adjacent solid-line grooves in the plurality of solid-line grooves may have a same value, for example, b1.

In some embodiments, the widths of the plurality of solid-line grooves may alternatively be different.

For example, as shown in (b) of FIG. 10, a width of a solid-line groove in the plurality of solid-line grooves that is close to the first portion may be greater than widths of the other solid-line grooves. For example, the width of the solid-line groove close to the first portion is a2, the widths of the other solid-line grooves are all a1, and a2 is greater than a1. The solid-line groove close to the first portion has a relatively large width, so that the solid-line groove may be filled with a large quantity of organic materials, which can effectively alleviate stress concentration in this region, and effectively prevent a crack from expanding to the first region and affecting display performance.

For example, as shown in (c) of FIG. 10, the plurality of solid-line grooves may include solid-line grooves that are arranged alternately and that have different widths. For example, a width of a relatively narrow solid-line groove is a1, a width of a relatively wide solid-line groove is a2, and the two solid-line grooves are arranged alternately in a direction perpendicular to the edge of the first portion.

In some embodiments, intervals between any two adjacent solid-line grooves in the plurality of solid-line grooves may alternatively be different.

For example, as shown in (d) of FIG. 10, an interval of two solid-line grooves that are in the plurality of solid-line grooves and that are close to the first portion may be greater than intervals between two adjacent solid-line grooves in the other solid-line grooves. For example, the interval between the two solid-line grooves close to the first portion is b2, the intervals between two adjacent solid-line grooves in the other solid-line grooves are all b1, and b2 is greater than b1. A relatively thick inorganic layer is superimposed on a position that is of the array structure layer and that is close to an edge, that is, an edge region of the second portion is more prone to crack. A groove having relatively high density is disposed in this region, so that the inorganic layer in this region may be filled with a larger quantity of organic materials. Therefore, stress concentration in this region can be effectively alleviated, and crack expansion can be effectively prevented.

It should be understood that when the grooves are a plurality of dashed-line grooves or a plurality of curved grooves, a similar arrangement is used. Details are not described again.

In this embodiment of this application, a distance between the groove and the edge of the display screen may be designed according to actual needs, to ensure packaging performance of the second portion of the array structure layer. In this embodiment of this application, a shortest distance between the groove and the edge of the display panel ranges from 200 microns to 250 microns. For example, when the groove includes a plurality of trenches, a distance between a trench at a position close to the edge of the array structure layer and the edge of the array structure layer may range from 200 μm to 250 μm. Since the inorganic layer of the second portion of the array structure layer is mainly used to complete packaging, that is, to prevent intrusion of water and oxygen, there is a sufficient distance between an outermost side of the groove and the edge of the display panel. Therefore, the inorganic layer on the edge of the array structure layer has a sufficient width to ensure packaging performance.

It should be understood that the distance between the trench and the edge of the array structure layer (which may be understood as the edge of the display panel) may be understood as a distance between the edge of the array structure layer and a point that is of the trench and that is closest to the edge.

In this embodiment of this application, a depth of the groove is less than or equal to a thickness of the array structure layer, that is, the groove may partially or completely penetrate the array structure layer.

In some embodiments, the depth of the groove is greater than or equal to one second of the thickness of the array structure layer. In this way, the second portion of the array structure layer may be filled with a relatively large quantity of organic materials, to alleviate a stress concentration problem of the second portion.

In this embodiment of this application, the array structure layer (namely, the BP inorganic layer) in the non-display region of the display panel is patterned and is filled with an organic matter, so that stress concentration of the BP inorganic layer can be alleviated, crack expansion can be prevented, and a problem that an inorganic layer at a packaging position on an edge of the display panel cracks can be alleviated effectively. Therefore, a GDS-type dark dot problem caused by cracking of the BP inorganic layer is alleviated, thereby prolonging a service life of the display panel, and improving user's experience.

Figure 11:
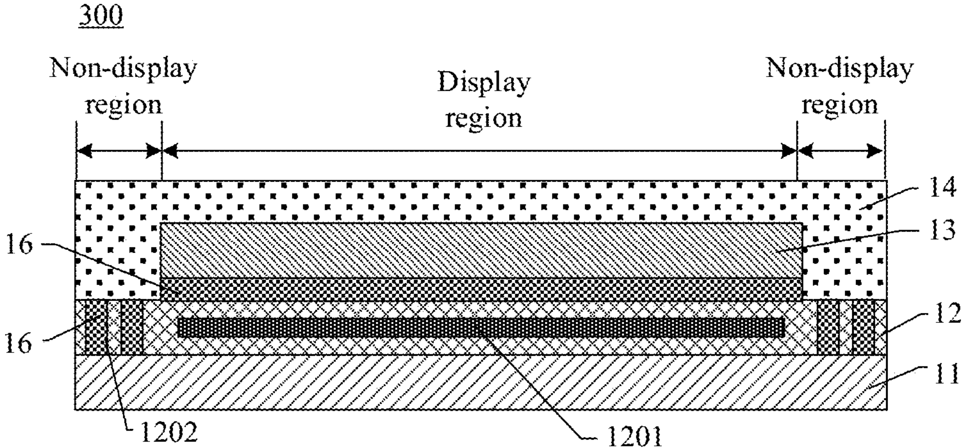
FIG. 11 is a schematic sectional view of another display panel according to an embodiment of this application.

FIG. 11 shows a schematic sectional view of another OLED display panel according to an embodiment of this application.

As shown in FIG. 11, the display panel 300 includes a base 11, an array structure layer 12, an organic planarization layer 16, a light-emitting component layer 13, and a packaging layer 14.

The base 11 is a matrix for forming another film layer and mainly plays roles in supporting and sealed packaging.

The array structure layer 12 is disposed on the base 11 and is configured to form a drive circuit 1201 that drives the light-emitting component layer 13 to emit light.

The array structure layer 12 includes a first portion and a second portion. The first portion is a projection portion of the display region on the array structure layer 12. The second portion is a projection portion of the non-display region on the array structure layer 12.

The drive circuit 1201 includes a thin-film transistor layer that is disposed on the first portion of the array structure layer 12. The thin-film transistor layer includes a plurality of thin-film transistors. Each of the plurality of thin-film transistors is configured to control, to be on/off, a display unit that is on the light-emitting component layer 13 and that corresponds to the thin-film transistor. The second portion of the array structure layer 12 is provided with the groove 1202.

The organic planarization (planarization, PLN) layer 16 is disposed on the array structure layer 12 and is configured to provide a planarized surface for the light-emitting component layer 13 to facilitate light extraction.

The organic planarization layer 16 covers the first portion of the array structure layer 12. The groove 1202 is filled with a first organic material. The organic planarization layer 16 includes the first organic material. In other words, the organic planarization layer 16 includes an organic material covering the first portion and an organic material (namely, the first organic material) filled in the groove 1202. The first organic material is the same as a material of the organic planarization layer 16.

The light-emitting component layer 13 is disposed on the organic planarization layer 16 and is configured to form a display unit for displaying an image.

The packaging layer 14 is disposed on the light-emitting component layer 13, covers the light-emitting component layer 13, and extends to the second portion of the array structure layer 12. The packaging layer 14 covers the second portion of the array structure layer 12 and covers the first organic material filled in the groove 1202. The packaging layer 14 mainly plays a role in packaging to prevent intrusion of water and oxygen.

Differences between the display panel 300 shown in FIG. 11 and the display panel 200 shown in FIG. 6 lie in that the filling layer 15 of the display panel 200 may be a film layer separately disposed for filling the groove 1202, and that the display panel 300 may include the organic planarization layer 16 for providing a planarized surface. Therefore, in the display panel 300, the organic planarization layer 16 may be used to fill the groove 1202. In this way, the first organic material filled in the groove 1202 is equivalent to the filling layer 15 in the display panel 200. Functions of the film layers, an arrangement of the groove 1202, and the like in the display panel 300 are similar to those in the display panel 200. For detailed, refer to the foregoing descriptions. For brevity, details are not described herein again.

In this embodiment of this application, the groove is fabricated in the non-display region of the display panel and is filled with an existing organic film layer such as a planarization layer. The array structure layer can be filled with the organic material according to a simple fabrication process obtained by slightly changing an existing fabrication process of a display panel, thereby alleviating the dark dot problem.

In some embodiments, the display panel further includes a signal cable layer located on the array structure layer. The signal cable layer is provided with a signal cable on the second portion of the array structure layer. The groove disposed on the second portion corresponds to a position of the signal cable.

Generally, a relatively thick inorganic layer is superimposed under the signal cable in the non-display region. Therefore, a groove may be disposed in a film layer under the signal cable in the non-display region, and filled with an organic matter. This can alleviate stress concentration of the BP inorganic layer, prevent crack expansion, effectively alleviate the dark dot problem, and prolong a service life of the display panel.

In some embodiments, the signal cable may include a voltage of source series (voltage of source series, VSS) signal cable.

In some embodiments, the second portion of the array structure layer includes an insulation layer, a buffer layer, a gate insulation layer, and an inter-layer dielectric layer that are stacked in sequence. All of the insulation layer, the buffer layer, the gate insulation layer, and the inter-layer dielectric layer are inorganic film layers.

With reference to FIG. 12 to FIG. 17, the following describes some specific non-restrictive examples of the embodiments of this application in more detail. It should be understood that the following embodiments merely illustrate a display panel structure that alleviates the dark dot problem in the foregoing manner of disposing a groove and filling the groove with an organic matter. However, the foregoing structure for alleviating the dark dot problem is also applicable to other display panels. Details are not described herein one by one.

Figure 12:
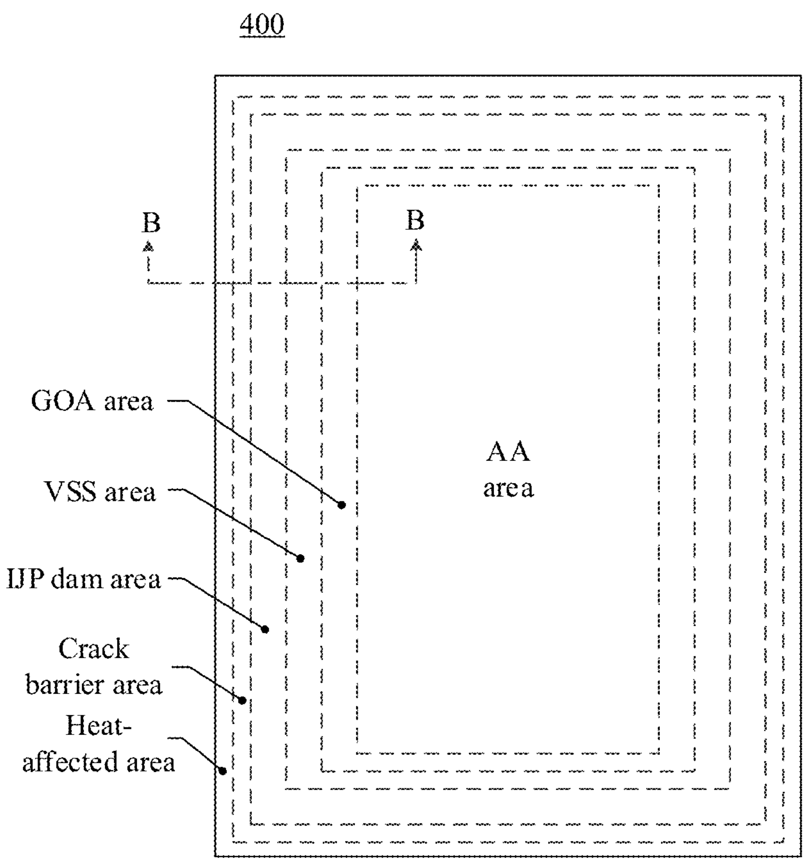
FIG. 12 is a schematic top view of a display panel according to an embodiment of this application.

FIG. 12 shows a schematic top view of a display panel according to an embodiment of this application.

As shown in FIG. 12, the display panel 400 includes a display region and a non-display region extending around the display region.

The display region is provided with a display unit, used for displaying an image. In some embodiments, the display region may also be referred to as a pixel area, a pixel light-emitting area, or an array area (array area, AA).

From the display region to an edge of the display panel, the non-display region sequentially includes a gate on array (gate on array, GOA) area, a voltage of source series (voltage of source series, VSS) area, an ink jet printing (ink jet printing, IJP) dam (dam) area, a crack (crack) barrier area, and a heat-affected area.

The GOA area is used to provide a row driver for an array substrate, that is, provide a driver for a TFT that controls the display unit to be on/off. Herein, the array substrate may be understood as a structure obtained after an array structure layer is formed on a base. The array substrate includes a drive circuit and the base.

The VSS area is used to provide a source voltage. Specifically, the VSS area is used to provide a voltage for a cathode (for example, the cathode 1015 in FIG. 3) in an OLED display panel.

The IJP dam area is used to prevent an ink jet printing layer applied on the display panel from overflowing, thereby achieving a better edge packaging effect.

The crack barrier area is used to prevent a cutting crack from expanding to the display region during cutting of the display panel, resulting in intrusion of water and oxygen.

The heat-affected area is an area reserved for a cutting process of the display panel. If a crack is generated in the cutting process, the heat-affected area can block the cutting crack.

It should be understood that area division of the display panel in this embodiment of this application is merely exemplary. FIG. 12 and subsequent drawings only schematically show approximate positions of the areas, and there are no strict boundaries between the areas.

Figure 13:
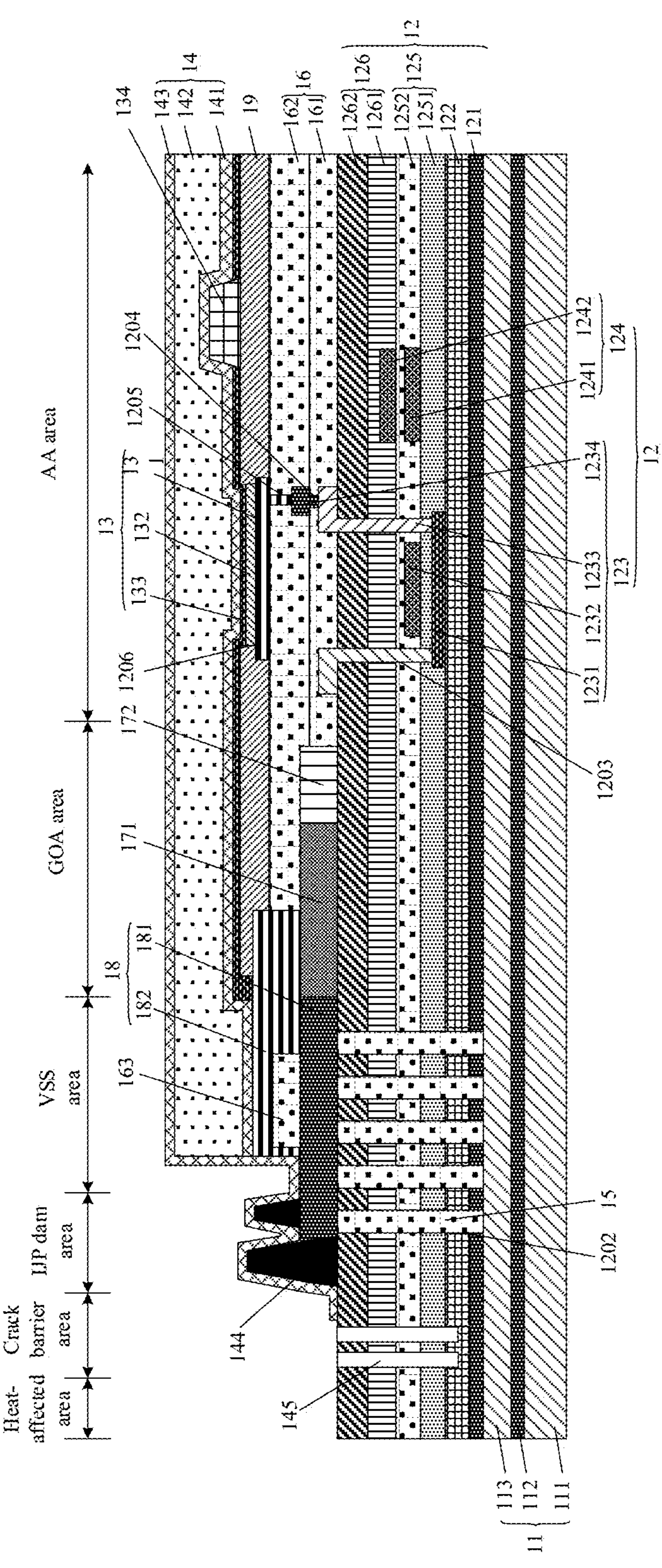
FIG. 13 is a schematic sectional view of a display panel according to an embodiment of this application.

FIG. 13 shows a schematic sectional view of an OLED display panel according to an embodiment of this application. For example, FIG. 13 may be a schematic sectional view along a line B-B of the display panel in FIG. 12.

As shown in FIG. 13, film layers of the display panel are all stacked on the base 11. The base 11 may include a first substrate 111, a barrier 112, and a second substrate 113 that are stacked. The barrier 112 is located between the first substrate 111 and the second substrate 113, and is attached to each of the first substrate 111 and the second substrate 113.

The first substrate 111 and the second substrate 113 are bases used for fabricating the display panel. Subsequently, fabrication of a thin-film transistor TFT, evaporation, packaging, and the like are all performed on the bases. The first substrate nil and the second substrate 113 may be glass substrates. In this case, the display panel is a hard display panel. The first substrate 111 and the second substrate 113 may be polyimide (polyimide, PI) substrates (substrates). In this case, the display panel is a flexible display panel.

Polyimide PI is a flexible plastic material with high tensile strength, bending strength and compressive strength, and has outstanding creep resistance and dimensional stability. Like glass, polyimide PI may be stacked with organic layers on a TFT and PI. An initial state of polyimide PI is liquid. To be used as a base for fabricating a display panel, a PI material may be first applied on a glass base referred to as carrier glass, and is then cured for formation.

The barrier (barrier) 112 is used to isolate the first substrate 111 from the second substrate 113, and can also play a role in isolating sodium ions and potassium ions in the carrier glass. The barrier 112 may be a silica ($SiO_2$) film layer. In some embodiments, the barrier 112 may alternatively be a silicon nitride (SiNx) film layer.

In this embodiment of this application, the base 11 includes two substrates that can enhance strength of the base 11. In some other embodiments, the base 11 may include one substrate or more than two substrates. A structure of the base 11 may vary correspondingly. Specifically, the structure may be flexibly designed according to actual needs, which is not particularly limited herein.

It should be understood that the first substrate 111 and the second substrate 113 may alternatively be made of another flexible material, which is not limited in this embodiment of this application.

In some embodiments, the base 11 may further include another film layer, for example, an amorphous silicon (a-Si) protective film layer that is used to absorb laser lift off (laser lift off, LLO) energy during peeling off of the display panel, thereby preventing damage to a TFT layer. The protective film layer may be disposed between the first substrate 111 and the second substrate 113, for example, the protective film layer is disposed on the barrier 112 and covers the barrier 112.

The array structure layer 12 is disposed on the base 11 and may include an insulation layer 121, a buffer layer 122, a TFT layer 123, a storage capacitor 124, a gate insulation layer 125, and an inter-layer dielectric layer 126.

The insulation layer 121 is disposed on the second substrate 113 and covers the second substrate 113. The insulation layer 121 is used to isolate the base 11 from the TFT layer 123, and can play a role in isolating sodium ions and potassium ions in the carrier glass.

The buffer (buffer) layer 122 is disposed on the insulation layer 121, covers the insulation layer 121, and can play roles in buffering and heat preservation. The buffer layer 122 may be a composite film layer, for example, a composite film layer of silicon nitride (SiNx) and silica ($SiO_2$), which can play a role in heat preservation in a subsequent annealing process.

The TFT layer 123 mainly includes an active layer 1231, a gate 1232, and a source/drain.

The storage capacitor 124 mainly includes a first electrode 1241 and a second electrode 1242.

The gate insulation (gate insulation, GI) layer 125 includes a first gate insulation layer 1251 and a second gate insulation layer 1252 that are stacked.

The active layer 1231 is disposed on the buffer layer 122 and used to form a conducting channel. The active layer 1231 may be made of amorphous silicon (a-Si) or poly-silicon (poly-silicon, p-Si), where the poly-silicon may be low temperature poly-silicon (low temperature poly-silicon, LTPS). A thin-film transistor using an LTPS technology may also be referred to as an LTPS TFT, which has high electron mobility, a small area of a thin-film circuit, a simple structure, and high stability. The material of the active layer 1231 may alternatively be a metal oxide, for example, indium gallium zinc oxide (indium gallium zinc oxide, IGZO) or the like.

The first gate insulation layer 1251 is disposed on the active layer 1231, covers the active layer 1231, and extends to the buffer layer 122. In some embodiments, the first gate insulation layer 1251 covers the active layer 1231 and the buffer layer 122. The first gate insulation layer 1251 is located between the gate 1232 and the active layer 1231, and is used to isolate the active layer 1231 from the gate 1232, thereby preventing conduction between the gate 1232 and the active layer 1231, and playing roles in insulation and static prevention.

The first gate insulation layer 1251 is made of an insulating material, for example, silica (silica) $SiO_2$, a composite stacked layer of $SiO_2$ and SiNx, or the like.

The gate 1232 and the first electrode 1241 are disposed on the first gate insulation layer 1251. The gate 1232 is disposed adjacent to the first electrode 1241 without conduction.

The gate 1232 is a gate of the thin-film transistor TFT. The gate is connected to a row electrode (which is not shown in the figure and may be learned through reference to the row electrode 1017 in FIG. 4), and is used to control conduction of a TFT channel, thereby controlling the display unit to be on/off. The gate 1232 is located above the active layer 1231. The gate 1232 is a conductor made of metal chromium (Cr), an alloy material of chromium, a molybdenum-tantalum (MoTa) alloy, aluminum (Al), molybdenum (Mo), copper (Cu), or another conductor with high electrical conductivity.

The first electrode 1241 is one of electrodes of the storage capacitor (storage capacitor, Cst) 124, is connected to a column electrode (not shown in the figure), and is used to charge the storage capacitor 124. The storage capacitor is used to maintain current, thereby driving the display panel. The first electrode 1241 and the gate 1232 may be fabricated in a same fabrication process, and may also be fabricated by using a same mask plate. In other words, the gate 1232 and the first electrode 1241 may be considered as being located on a same film layer without mutual conduction.

The first electrode 1241 may be made of the same material as the gate 1232, for example, metal chromium (Cr), an alloy material of chromium, a molybdenum-tantalum (MoTa) alloy, aluminum (Al), molybdenum (Mo), copper (Cu), or another conductor with high electrical conductivity.

The second gate insulation layer 1252 is disposed on the gate 1232 and the first electrode 1241, covers the gate 1232 and the first electrode 1241, and extends to the first gate insulation layer 1251. In some embodiments, the second gate insulation layer 1252 covers the gate 1232, the first electrode 1241, and the first gate insulation layer 1251.

Located between the first electrode 1241 and the second electrode 1242, the second gate insulation layer 1252 serves as an insulation layer between storage capacitors, which is equivalent to a capacitor dielectric layer, to prevent conduction between the first electrode 1241 and the second electrode 1242, so that the first electrode 1241 and the second electrode 1242 form a storage capacitor Cst.

The second gate insulation layer 1252 is made of an insulating material, for example, silicon nitride (silicon nitride) SiNx.

The second electrode 1242 is disposed on the second gate insulation layer 1252, located above the first electrode 1241, and opposite the first electrode 1241. The second electrode 1242 is another electrode of the storage capacitor 124, and is connected to the gate of the thin-film transistor that drives the display unit to emit light. The first electrode 1241 and the second electrode 1242 may provide a stable switch-on voltage to the thin-film transistor that drives the display unit to emit light. A structure shown in FIG. 13 is used as an example. The first electrode 1241 and the second electrode 1242 are arranged opposite each other. In some embodiments, the first electrode 1241 may be referred to as a lower electrode of the storage capacitor 124, and the second electrode 1242 may be referred to as an upper electrode of the storage capacitor 124. The second electrode 1242 may be made of the same material as the first electrode 1241. For details, refer to the foregoing descriptions. Details are not described again.

The inter-layer dielectric (inter layer dielectric, ILD) layer 126 is disposed on the second electrode 1242, covers the second electrode 1242, and extends to the second gate insulation layer 1252. The inter-layer dielectric layer 126 is used to isolate the gate 1232 from the column electrode (which may also be referred to as SD metal), and may provide hydrogen atoms (H atoms) for a poly-silicon conducting channel in the active layer 1231 to fill a defect.

Generally, the inter-layer dielectric layer 126 is a composite film layer, for example, including a first inter-layer dielectric layer 1261 and a second inter-layer dielectric layer 1262 that are stacked. The first inter-layer dielectric layer 1261 is located on a side close to the second electrode 1242. The second inter-layer dielectric layer 1262 is located on a side away from the second electrode 1242. The first inter-layer dielectric layer 1261 and the second inter-layer dielectric layer 1262 are made of different insulating materials. For example, the first inter-layer dielectric layer 1261 may be made of silica $SiO_2$, and the second inter-layer dielectric layer 1262 may be made of silicon nitride SiNx.

In this embodiment of this application, the source/drain (source/drain, S/D) in the TFT may include a first source/drain portion 1233 and a second source/drain portion 1234.

The first source/drain portion 1233 is disposed on the inter-layer dielectric layer 126, passes through all film layers between the active layer 1231 and the first source/drain portion 1233, and is connected to the active layer 1231. In other words, a film layer, for example, the inter-layer dielectric layer 126 or the gate insulation layer 125, between the active layer 1231 and the first source/drain portion 1233 may be provided with a first hole 1203. The first source/drain portion 1233 is disposed on the inter-layer dielectric layer 126 and filled in the first hole 1203, thereby implementing contact with the active layer 1231. The first source/drain portion 1233 includes a source (source, S) and a drain (drain, D). The source S and the drain D are separated from each other and each are in contact with the active layer 1231, so that part of the active layer 1231 leaks out from a space between the source S and the drain D. The gate 1232 is located between the source S and the drain D and is not in contact with the source S and the drain D. The source S is connected to the column electrode. The drain D is connected to the anode 131 of the display unit through the second source/drain portion 1234, and is used to control luminance of the display unit. A position of the second source/drain portion 1234 is described below in detail. Details are not described herein.

It can be learned from the figure that, in the non-display region of the display panel, for example, the VSS area, a relatively thick inorganic layer is superimposed on the base 11. For example, the insulation layer 121, the buffer layer 122, the gate insulation layer 125, and the inter-layer dielectric layer 126 are stacked in sequence. Therefore, a relatively thick BP inorganic layer (including the insulation layer 121, the buffer layer 122, the gate insulation layer 125, and the inter-layer dielectric layer 126) is superimposed on the non-display region of the display panel, for example, the VSS area, and has a relatively high elastic modulus. When the display panel is bent or struck, the inorganic layer in the non-display region is prone to crack, which easily causes intrusion of water and oxygen, and results in a dark dot problem.

To alleviate stress concentration in a region that is of the non-display region and that is prone to crack, in this embodiment of this application, a groove 1202 is disposed in a region that is of the non-display region and where the inorganic layer is superimposed; and the groove 1202 is filled with the filling layer 15 (or the first organic material described above). A material of the filling layer 15 is an organic material, for example, polyimide, polytetrafluoroethylene, acrylic resin, polyethylene, polyvinyl chloride, polypropylene, phenolic resin, epoxy resin, polybutadiene, polyisoprene, chloroprene rubber, butyl rubber, or the like. In this case, the groove is fabricated by patterning a region that is of the non-display region and that has a relatively thick inorganic layer (for example, the BP inorganic layer in the VSS area), and is filled with an organic matter, thereby playing roles in buffering stress on this region and preventing crack expansion.

An elastic modulus of the material of the filling layer 15 may range from 2 gigapascals (GPa) to 5 GPa, and transmittance of visible light may be 95%±3%.

As shown in FIG. 13, the groove 1202 in the non-display region may be fabricated in the same process as the first hole 1203 in the display region, or fabricated after fabrication of the inter-layer dielectric layer 126 and before fabrication of the first hole 1203, or fabricated in a process next to fabrication of the first hole 1203, which is not limited in this embodiment of this application.

For a shape of the groove 1202, reference may be made to related descriptions in FIG. 8 to FIG. 10. For brevity, details are not described herein again.

A depth of the groove 1202 may be flexibly designed according to actual needs. For example, the groove 1202 may penetrate the inter-layer dielectric layer 126, the gate insulation layer 125, the buffer layer 122, and the insulation layer 121; or the depth of the groove 1202 may be less than the sum of depths of the inter-layer dielectric layer 126, the gate insulation layer 125, the buffer layer 122, and the insulation layer 121; or the depth of the groove 1202 may be equal to a depth of the first hole 1203.

In one embodiment, the filling layer 15 may be filled in the groove 1202 in a separate process, for example, filled in the groove 1202 before deposition of the first source/drain portion 1233, or filled in the groove 1202 in a process after deposition of the first source/drain portion 1233, or filled in the groove 1202 in any process before fabrication of a film layer capable of covering the groove 1202.

In another embodiment, the filling layer 15 may be fabricated in a subsequent process of fabricating an organic film layer, that is, the filling layer 15 and the organic film layer are made of the same material and are fabricated in the same process.

For example, the first planarization layer 161 is fabricated after fabrication of the first source/drain portion 1233. The first planarization layer 161 is disposed on the first source/drain portion 1233, covers the first source/drain portion 1233, and extends to the inter-layer dielectric layer 126. In addition, the groove 1202 is filled with the first planarization layer 161 to form the foregoing filling layer 15, namely, the first organic material. The first planarization layer 161 covers a region that is of the inter-layer dielectric layer 126 and that corresponds to an AA region, and is filled in the groove 1202. A side surface, away from the base 11, of the first planarization layer 161 (namely, the filling layer 15 or the first organic material) in the groove 1202 is flush with a side surface, away from the base 11, of the inter-layer dielectric layer 126.

In some embodiments, a gate on array (gate on array, GOA) 171 and an emission on array (emission on array, EOA) 172 may also be disposed on the inter-layer dielectric layer 126 before, after, or during fabrication of the first source/drain portion 1233. The gate on array 171 is configured to provide a row driver for an array substrate. The emission on array 172 is configured to provide an emission driver for the array substrate. In other words, the TFT controls the display unit to be on/off, but the gate on array 171 and the emission on array 172 jointly control the TFI to be on/off. Therefore, multi-level control is realized.

The gate on array 171 and the emission on array 172 are not electrically connected to the source/drain of the TFT layer 123.

It should be understood that positions of the gate on array 171 and the emission on array 172 in FIG. 13 are merely exemplary, and may be designed flexibly by those skilled in the art according to actual needs. In addition, in some embodiments, there may alternatively be no emission on array 172, that is, the gate on array 171 can directly control the TFT to be on/off. In this embodiment of this application, a region where the gate on array 171 and the emission on array 172 are located may be considered as the GOA area described above. The GOA area is located at a periphery of the AA region and is disposed around the AA region.

The gate on array 171 and the emission on array 172 may be fabricated before or after fabrication of the first planarization layer 161, which is not limited in this embodiment of this application.

After the fabrication of the first planarization layer 161, the second source/drain portion 1234 described above is disposed on the first planarization layer 161, passes through a second hole 1204 disposed on the first planarization layer 161, and is in contact with the first source/drain portion 1233.

In this embodiment of this application, the display panel 300 further includes a light-emitting component layer 13 disposed on the array structure layer 12. The light-emitting component layer 13 includes an anode 131, a hole transport layer (which is not shown in the figure and may be learned through reference to the hole transport layer 1012 in FIG. 3), an organic light-emitting layer 132, an electron transport layer (which is not shown in the figure and may be learned through reference to the electron transport layer 1014 in FIG. 3), and a cathode 133. A voltage of the anode 131 is provided by the source/drain of the TFT layer 123. A voltage of the cathode 133 is provided by the voltage of source series VSS 18.

As shown in FIG. 13, the voltage of source series 18 includes a first signal cable portion 181 and a second signal cable portion 182. The first signal cable portion 181 is disposed on the inter-layer dielectric layer 126 and covers the filling layer 15 filled in the groove 1202. As the first signal cable portion 181 may be fabricated in the same process as the second source/drain portion 1234, the first signal cable portion 181 may be made of the same material as the second source/drain portion 1234. Since the first planarization layer 161 covers the region that is of the inter-layer dielectric layer 126 and that corresponds to the AA region, and is filled in the groove 1202, if the first signal cable portion 181 is fabricated in the same process as the second source/drain portion 1234, the first signal cable portion 181 may cover part of a region that is of the inter-layer dielectric layer 126 and that corresponds to the non-display region, and covers the first planarization layer 161 filled in the groove 1202; and the second source/drain portion 1234 is disposed on the first planarization layer 161.

To provide the anode 131 with a relatively flat surface, the organic planarization layer 16 in this embodiment of this application further includes a second planarization layer 162. The second planarization layer 162 is disposed on the second source/drain portion 1234, covers the second source/drain portion 1234, and extends to the first planarization layer 161. The second planarization layer 162 may cover the second source/drain portion 1234 and the first planarization layer 161, and cover part of regions of the emission on array 172 and the gate on array 171.

In some embodiments, a third planarization layer 163 is also disposed on part of a region of the first signal cable portion 181 to provide the first signal cable portion 181 and the second signal cable portion 182 with relatively flat surfaces, thereby reducing impedance and ensuring that a light-emitting surface is flat. The third planarization layer 163 may be a film layer fabricated separately, for example, is fabricated before or after fabrication of the second planarization layer 162. The third planarization layer 163 may alternatively be fabricated in the same process as the second planarization layer 162. Therefore, it may be considered that the third planarization layer 163 is part of the second planarization layer 162 but has a different function. In this embodiment of this application, the third planarization layer 163 is separated from and does not communicate with the second planarization layer 162.

The anode 131 is disposed on the second planarization layer 162, and is in contact with the second source/drain portion 1234 after passing through a third hole 1205 in the second planarization layer 162. In this way, the second source/drain portion 1234 is connected to the first source/drain portion 1233 and the anode 131, and can transmit a signal on the column electrode (namely, the data line) to the anode 131, thereby controlling luminance of the display unit.

The second signal cable portion 182 is disposed on the third planarization layer 163, covers the third planarization layer 163, and extends to the first signal cable portion 181. In this way, the first signal cable portion 181 is electrically connected to the second signal cable portion 182. The second signal cable portion 182 is also in contact with the cathode 133, so that voltages provided by the first signal cable portion 181 and the second signal cable portion 182 may be provided for the cathode 133. A manner of a connection between the cathode 133 and the second signal cable portion 182 is described below in detail, and is not described herein.

A pixel definition layer (pixel definition layer, PDL) 19 included in the display panel 300 is disposed on the anode 131, covers part of the anode 131, and extends to the second planarization layer 162. As shown in FIG. 13, the pixel definition layer 19 is provided with an opening 1206. The opening 1206 corresponds to a position of the anode 131, so that the anode 131 is exposed from the pixel definition layer 19. A region of the opening 1206 is a light-emitting region on the display panel.

A pixel spacer (pixel spacer, PS) layer 134 is disposed on the pixel definition layer 19, and is used to support a mask plate used for evaporation of the organic light-emitting layer 132 and evaporation of the cathode. For example, the mask plate is a fine metal mask (fine metal mask, FMM).

The organic light-emitting layer 132 in the light-emitting component layer 13 is disposed on the anode 131 and located in the opening 1206. The organic light-emitting layer 132 can emit light after a voltage is applied between the anode 131 and the cathode 133. Herein, the opening 1206 may form a resonant cavity. A side wall of the opening 1206 can reflect light, thereby achieving higher light emitting efficiency.

The cathode 133 is disposed on the organic light-emitting layer 132, covers the organic light-emitting layer 132, extends to the pixel definition layer 19 and the second signal cable portion 182, and is used to provide electrons for a light-emitting component. In this way, the voltage of source series may be provided for the cathode 133 through the first signal cable portion 181 and the second signal cable portion 182.

In this embodiment of this application, a region where the first signal cable portion 181 and the second signal cable portion 182 are located may be considered as the VSS area described above.

In other words, in the display panel provided in this embodiment of this application, the active layer 1231 is disposed between the buffer layer 122 and the first gate insulation layer 1251; and the first gate insulation layer 1251 coats the active layer 1231 and extends to the buffer layer 122. The gate 1232 is disposed between the first gate insulation layer 1251 and the second gate insulation layer 1252; the second gate insulation layer 1252 coats the gate 1232 and extends to the first gate insulation layer 1251; and the gate 1232 is disposed opposite the active layer 1231.

The first source/drain portion 1233 is disposed between the inter-layer dielectric layer 126 and the first planarization layer 161; the first planarization layer 161 coats the first source/drain portion 1233 and is filled in the groove 1202; and the first source/drain portion 1233 is connected to the active layer 1231 after sequentially penetrating the inter-layer dielectric layer 126, the second gate insulation layer 1252, and the first gate insulation layer 1251. The second source/drain portion 1234 is disposed between the first planarization layer 161 and the second planarization layer 162; the second planarization layer 162 coats the second source/drain portion 1234 and extends to the first planarization layer 161; and the second source/drain portion 1234 is connected to the first source/drain portion 1233 after penetrating the first planarization layer 161.

A first signal cable portion 181 is disposed in a region, corresponding to the groove 1202, of the inter-layer dielectric layer 126. The first signal cable portion 181 is a signal cable fabricated on the same layer as the second source/drain portion 1234, and the first signal cable portion 181 covers the filling layer 15 (or referred to as the first organic material) filled in the groove 1202 and the inter-layer dielectric layer around the groove.

The anode 131 is disposed on the second planarization layer 162, and is connected to the second source/drain portion 1234 after penetrating the second planarization layer 162. A second signal cable portion 182 is disposed on the first signal cable portion 181, is connected to the first signal cable portion 181, and is a signal cable fabricated on the same layer as the anode 131. The cathode 133 is disposed on the organic light-emitting layer 132, covers the organic light-emitting layer 132, and extends to the second signal cable portion 182. The first signal cable portion 182 and the second signal cable portion 182 are part of a voltage of source series VSS signal cable.

An IJP dam area is disposed on a side, close to an edge of the display panel, of the VSS area. The IJP dam area is provided with one or more dams 144 used for preventing an ink jet printing layer in the packaging layer 14 from overflowing. As shown in FIG. 13, the dam 144 may be disposed on the inter-layer dielectric layer 126 or disposed on the first signal cable portion 181, which is not limited in this embodiment of this application.

The dam 144 may be fabricated after fabrication of the second source/drain portion 1234 and before fabrication of the packaging layer 14, for example, fabricated in a process after fabrication of the cathode 133 or fabricated in a process after fabrication of the first signal cable portion 181, which is not limited in this embodiment of this application.

A crack barrier area is disposed on a side, close to the edge of the display panel, of the IJP dam area. The crack barrier area generally includes an inter-layer dielectric layer 126, a gate insulation layer 125, a buffer layer 122, an insulation layer 121, a base 11, and the like. The crack barrier area is provided with one or more trenches 145 used for preventing a cutting crack from expanding to the AA region.

A heat-affected area is disposed on a side, close to the edge of the display panel, of the crack barrier area.

If the display panel 300 is a flexible display panel, a packaging process of the display panel generally uses a thin-film encapsulation (thin-film encapsulation, TFE) process to prevent moisture and oxygen from entering the display panel. In this embodiment of this application, the display panel 300 includes the packaging layer 14 disposed on the light-emitting component layer 13. The packaging layer 14 includes an organic layer and an inorganic layer.

For example, the packaging layer 14 includes a first chemical vapor deposition layer 141, an ink jet printing layer 142, and a second chemical vapor deposition layer 143 that are stacked. The first chemical vapor deposition layer 141 is disposed on the cathode 133, covers the cathode 133, and extends to the second signal cable portion 182, the first signal cable portion 181, the dam 144, and the inter-layer dielectric layer 126. The ink jet printing layer 142 is disposed on the first chemical vapor deposition layer 141 and located in a region surrounded by the dam 144. The second chemical vapor deposition layer 143 is disposed on the ink jet printing layer 142, covers the ink jet printing layer 142, and extends to the first chemical vapor deposition layer 141. Herein, the first chemical vapor deposition layer 141 and the second chemical vapor deposition layer 143 are inorganic packaging layers used for preventing an electroluminescent component and the cathode from being intruded by water and oxygen. The ink jet printing layer 142 is configured to implement planarization and play a role in wrapping a foreign matter, thereby improving packaging performance.

In this embodiment of this application, the VSS area that is of the display panel and that is prone to crack is structurally improved as follows: An inorganic layer below the VSS area on the edge of the display panel is patterned to fabricate the groove, and the groove is filled with an organic matter. This can alleviate stress concentration of the BP inorganic layer below the VSS area; prevent crack expansion; effectively alleviate a GDS-type dark dot problem that is in the VSS area on the edge of the display panel and that is caused by cracking of the BP inorganic layer; and prolong a service life of the display panel.

It should be understood that the structure of the display panel 300 in this embodiment of this application is merely exemplary. In some other embodiments, the display panel may have another structural form, such as a TFT of another structural form or a driving structure of another form, provided that a groove can be disposed in the non-display region of the display panel and be filled with an organic matter. Therefore, cracks are reduced, expansion of a crack is prevented, and the dark dot problem is alleviated.

For ease of understanding, the following describes, with reference to FIG. 14 to FIG. 17, a fabrication process of the display panel shown in FIG. 13.

Herein, that the display panel is a flexible display panel is used as an example. Film layers of the display panel may be peeled off after being stacked on carrier glass. The carrier glass is cleaned before stacking, to prevent impurities from polluting the film layers and to facilitate applying the film layers with uniform thicknesses.

Reference is made to FIG. 14.

Step 1: Form a base on the carrier glass.

For example, the first substrate 111, the barrier 112, and the second substrate 113 may be sequentially formed on the carrier glass 104.

Specific steps are as follows.

Step 1-1: Form the first substrate 111 on the carrier glass.

For example, the first substrate 111 is made of a polyimide PI material. In this step, PI may be applied on the carrier glass and be cured, and then the first substrate 111 is formed. A thickness of the first substrate 111 may range from 8.5 μm to 10 μm; and an error of the thickness may be within 1 μm.

Step 1-2: Form the barrier 112 on the first substrate 111.

For example, a chemical vapor deposition (chemical vapor deposition, CVD) technology, for example, a plasma enhanced chemical vapor deposition (plasma enhanced chemical vapor deposition, PECVD) technology or a microwave plasma chemical vapor deposition (microwave plasma chemical vapor deposition, MPCVD) technology may be used to deposit the barrier 112 on the first substrate 111.

The barrier 112 may be a $SiO_2$ film layer. A thickness of the barrier 112 may range from 550 nanometers (nm) to 750 nanometers (nm).

Step 1-3: Form the second substrate 113 on the barrier 112.

For example, the second substrate 113 is made of a polyimide PI material. A thickness of the second substrate 113 and the thickness of the first substrate 111 may be the same, and may have the same error.

In some embodiments, there may also be a protective layer disposed between the first substrate 111 and the second substrate 113. The protective layer may absorb LLO energy subsequently, to play a role in preventing the LLO energy from damaging the thin-film transistor TFT. For example, the protective layer may be formed on the barrier 112, that is, the protective layer is located between the barrier 112 and the second substrate 113.

The protective layer may be an amorphous silicon (a-Si) film layer. A thickness of the protective layer may range from 4 nm to 5 nm.

In this embodiment of this application, the first substrate 111, the barrier 112, and the second substrate 113 are all formed via full-side applying.

Figure 15:
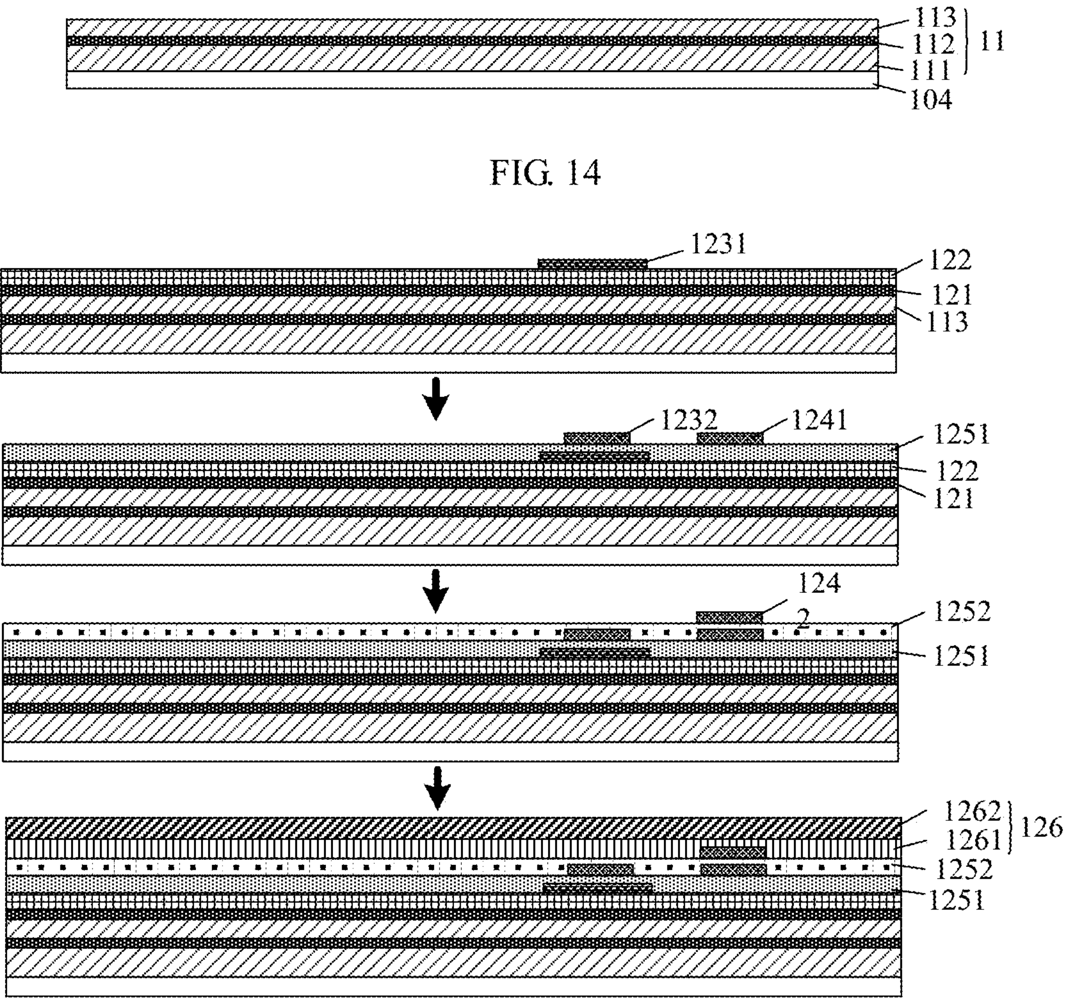

Further reference is made to FIG. 15.

Step 2: Form the array structure layer on the base.

For example, the insulation layer 121, the buffer layer 122, the active layer 1231, the first gate insulation layer 1251, the gate 1232, the first electrode 1241, the second gate insulation layer 1252, the second electrode 1242, the inter-layer dielectric layer 126, and the source/drain are sequentially formed on the base. Specific steps are as follows.

Step 2-1: Form the insulation layer 121 on the second substrate 113.

For example, the insulation layer 121 may be fabricated in the same manner as the barrier 112 shown in FIG. 14. For example, the PECVD technology is used to deposit the insulation layer 121 on the second substrate 113.

The insulation layer 121 may be a $SiO_2$ film layer. A thickness of the insulation layer 121 may range from 550 nm to 750 nm.

It should be understood that the barrier 112 shown in FIG. 14 and the insulation layer 121 shown in FIG. 15 may be both considered to play a role in isolating a substrate (for example, the first substrate 111 or the second substrate 113) in the base from another film layer, may both play a role in isolating metal ions such as potassium ions and sodium ions in the carrier glass, and may further function as the buffer layer.

Step 2-2: Form the buffer layer 122 on the insulation layer 121.

For example, the buffer layer 122 may be deposited on the insulation layer 121 by using the PECVD technology. The buffer layer 122 may be a single film layer or a composite film layer. When using the composite film layer, the buffer layer 122 can play a role in heat preservation in a subsequent process such as an excimer laser annealing (excimer laser annealing, ELA) process.

In one embodiment, the buffer layer 122 is a composite film layer of a SiNx film layer and a $SiO_2$ film layer. A thickness of the SiNx film layer may range from 180 nm to 250 nm. A thickness of the $SiO_2$ film layer may range from 300 nm to 350 nm.

Step 2-3: Form the active layer 1231 of the TFT on the buffer layer 122.

The active layer 1231 may be an amorphous silicon layer, a poly-silicon layer, or a metal oxide layer, such as an IGZO layer, which is used to form a conducting channel of the thin-film transistor.

For example, conversion from amorphous silicon to polysilicon may be implemented by using the PECVD technology to deposit the amorphous silicon layer on the buffer layer 122, carrying out dehydrogenation (under the 450° C. condition for 2 hours), and then carrying out an excimer laser annealing ELA process. Processes including exposure, development, and etching are performed on the polysilicon layer to pattern the channel of the TFT, that is, form the active layer 1231 of the TFT.

Step 2-4: Form the first gate insulation layer 1251 on the active layer 1231, where the first gate insulation layer 1251 covers the active layer 1231 and extends to the buffer layer 122.

For example, the first gate insulation layer 1251 may be deposited on the active layer 1231 and the buffer layer 122 by using the PECVD technology, thereby isolating the gate 1232 from the active layer 1231.

The first gate insulation layer 1251 may be a $SiO_2$ film layer. A thickness of the first gate insulation layer 1251 may range from 110 nm to 130 nm.

Step 2-5: Form the gate 1232 and the first electrode 1241 on the first gate insulation layer 1251, where the gate 1232 is separated from the first electrode 1241, and the gate 1232 is located above the active layer 1231 and is opposite the active layer 1231.

For example, a gate pattern and an electrode pattern of the capacitor, namely, the gate 1232 and the first electrode 1241 of the storage capacitor, may be formed by depositing a first metal layer on the first gate insulation layer 1251 by using a sputtering (sputtering) technology and then performing processes including exposure, development, and etching on the first metal layer. The gate 1232 and the first electrode 1241 are respectively used as the gate of the TFT and the lower electrode of the storage capacitor.

A material of the first metal layer (namely, the gate 1232 or the first electrode 1241) may be metal Mo, copper Cu, aluminum Al, or the like. A thickness of the first metal layer may range from 220 nm to 250 nm.

Step 2-6: Form the second gate insulation layer 1252 on the gate 1232 and the first electrode 1241. The second gate insulation layer 1252 covers the gate 1232 and the first electrode 1241, and extends to the first gate insulation layer 1251.

For example, the second gate insulation layer 1252 may be deposited on the gate 1232 and the first electrode 1241 by using the PECVD technology, thereby isolating the first electrode 1241 from the second electrode 1242. Herein, the second gate insulation layer 1252 functions as a capacitor dielectric layer.

The second gate insulation layer 1252 may be a SiNx film layer. A thickness of the second gate insulation layer 1252 may range from 120 nm to 140 nm.

Step 2-7: Form the second electrode 1242 on the second gate insulation layer 1252. The second electrode 1242 is located above the first electrode 1241 and opposite the first electrode 1241.

For example, an electrode pattern of the capacitor, namely, the second electrode 1242 of the storage capacitor, may be formed by depositing a second metal layer on the second gate insulation layer 1252 by using the sputtering technology and then performing processes including exposure, development, and etching on the second metal layer. The second electrode 1242 may be used as the upper electrode of the storage capacitor.

A material of the second metal layer (namely, the second electrode 1242) may be metal Mo, copper Cu, aluminum Al, or the like. A thickness of the second metal layer may range from 220 nm to 250 nm.

Step 2-8: Form the inter-layer dielectric layer 126 on the second electrode 1242, where the inter-layer dielectric layer 126 covers the second electrode 1242 and extends to the second gate insulation layer 1252.

For example, the inter-layer dielectric layer 126 may be deposited on the second electrode 1242 by using the PECVD technology. Then, hydrogenation (under the 350° C. condition for 2 hours) is performed on the inter-layer dielectric layer 126, thereby repairing a dangling bond on a polysilicon surface of the active layer 1231.

The inter-layer dielectric layer 126 may be a composite film layer, including a first inter-layer dielectric layer 1261 and a second inter-layer dielectric layer 1262 that are stacked. The first inter-layer dielectric layer 1261 is formed on the second electrode 1242 and extends to the second gate insulation layer 1252; and the second inter-layer dielectric layer 1262 is formed on the first inter-layer dielectric layer 1261.

The first inter-layer dielectric layer 1261 may be a $SiO_2$ film layer. A thickness of the first inter-layer dielectric layer 1261 may range from 300 nm to 350 nm.

The second inter-layer dielectric layer 1262 may be a SiNx film layer. A thickness of the second inter-layer dielectric layer 1262 may range from 200 nm to 250 nm.

The insulation layer 121, the buffer layer 122, the first gate insulation layer 1251, the second gate insulation layer 1252, the first inter-layer dielectric layer 1261, and the second inter-layer dielectric layer 1262 may be all formed via full-side applying.

Figure 16:
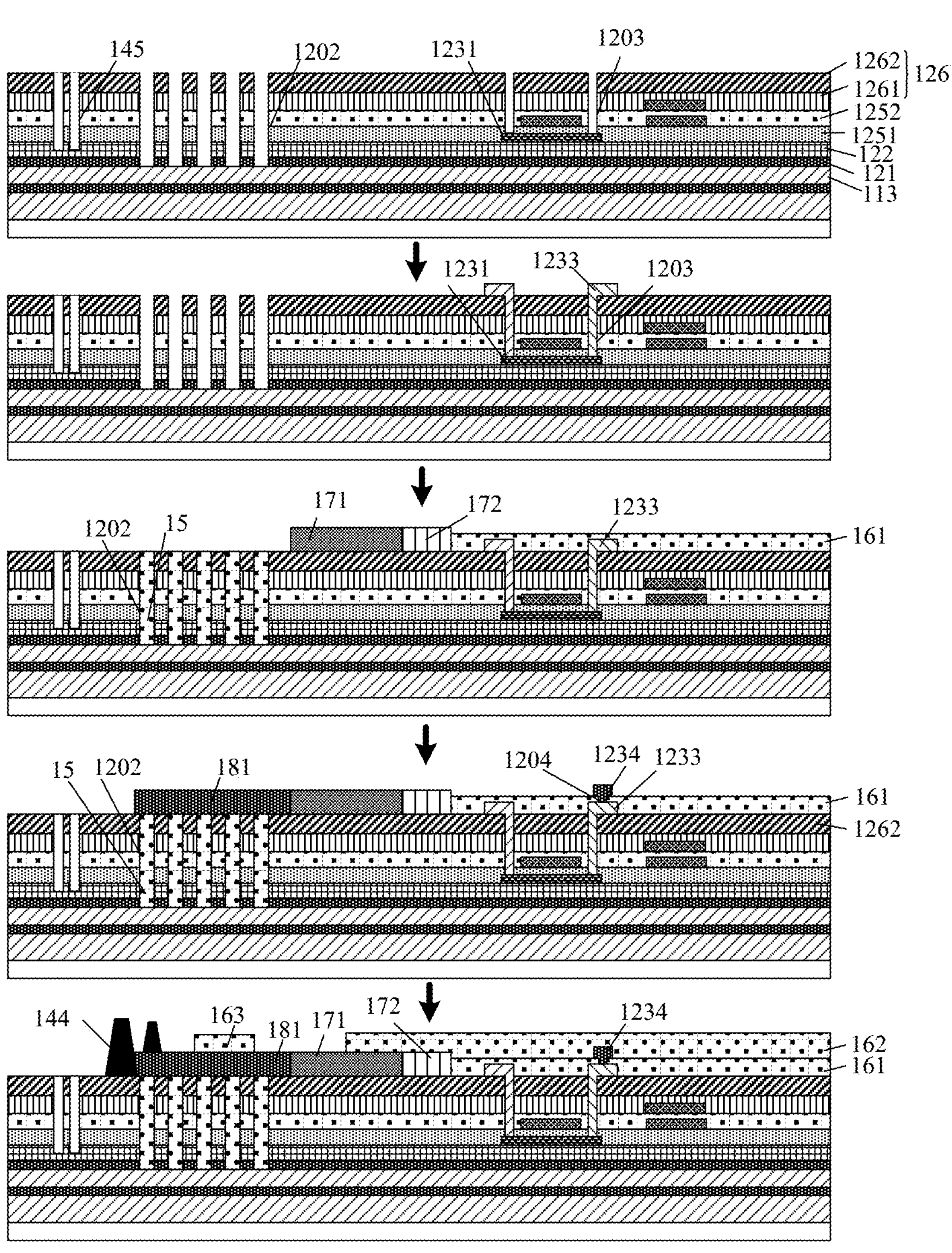

Further reference is made to FIG. 16.

Step 2-9: Etch the film layer of the display region to form the first hole 1203, where the first hole 1203 extends from a surface of the second inter-layer dielectric layer 1262 to the active layer 1231.

For example, the first hole 1203 penetrates the second inter-layer dielectric layer 1262, the first inter-layer dielectric layer 1261, the second gate insulation layer 1252, and the first gate insulation layer 1251, and communicates with the active layer 1231. The first hole 1203 avoids a position of the gate.

In this step, the film layer of the non-display region may also be etched to form the groove 1202. The groove 1202 extends from the surface of the second inter-layer dielectric layer 1262 to the base or a film layer above the base.

For example, the groove 1202 may penetrate the second inter-layer dielectric layer 1262, the first inter-layer dielectric layer 1261, the second gate insulation layer 1252, the first gate insulation layer 1251, the buffer layer 122, and the insulation layer 121, and communicates with the second substrate 113 of the base. Alternatively, a depth of the groove 1202 may be equal to a depth of the first hole 1203. For a structure of the groove 1202, refer to related descriptions in FIG. 8 to FIG. 10. For brevity, details are not described herein again.

As an example, the groove 1202 may be a rectangular groove; and a width of the groove 1202 may range from 20 μm to 25 μm. There may be one or more grooves 1202. When there are a plurality of grooves 1202 (for example, there are 3, 4, or 5 grooves), a distance between two adjacent grooves may range from 20 μm to 25 μm. This can ensure that an inorganic layer that is thick enough is retained in the non-display region, thereby ensuring packaging performance and preventing intrusion of water and oxygen.

In this step, etching may be further performed on a film layer in a region between the groove 1202 and the edge of the display panel to form one or more trenches 145, thereby preventing a cutting crack from expanding to the display region.

In this embodiment of this application, etching performed on the first hole 1203, the groove 1202, and the trenches 145 may be dry etching, that is, a voltage is applied to a specific gas (for example, chlorine) placed in a low pressure state, thereby exciting the gas into plasma; and chemical etching or ion bombardment is performed on a specific film layer, thereby removing the film layer.

Step 2-10: Form the first source/drain portion 1233 on the second inter-layer dielectric layer 1262, where the first source/drain portion 1233 is filled in the first hole 1203 and is in contact with the active layer 1231.

For example, a third metal layer may be deposited on the second inter-layer dielectric layer 1262; and then, processes including exposure, development, and etching are performed on the third metal layer to form the first source/drain portion 1233 and a pattern of a source/drain (SD) cable. The first source/drain portion 1233 is the source/drain of the TFT. The SD cable may be considered as the column electrode (or data line) described above, and is used to input a data (data) signal for a light-emitting component layer, thereby controlling luminance.

The third metal layer may be a composite film layer, for example, a titanium-aluminum-titanium (TiAlTi) composite film layer. Thicknesses of film layers in the TiAlTi composite film layer range from 30 nm to 50 nm, from 650 nm to 700 nm, and from 30 nm to 50 nm, respectively.

Step 2-11: Form the gate on array 171 and the emission on array 172 on the second inter-layer dielectric layer 1262.

The gate on array 171 is configured to provide a row driver for an array substrate. The emission on array 172 is configured to provide an emission driver for the array substrate.

Step 2-12: Form the first planarization layer 161 on the first source/drain portion 1233, where the first planarization layer 161 covers the first source/drain portion 1233, extends to the second inter-layer dielectric layer 1262, and is filled in the groove 1202.

For example, after SD patterning is completed, an organic film layer may be applied on an entire surface, where the organic film layer is also filled in the groove 1202. Then, part of an organic film layer in the display region, an organic film layer overflowing from the groove 1202, and an organic film layer at a position on the edge of the display panel (for example, a region between the groove 1202 and the edge of the display panel) are removed by using processes of halftone mask (halftone mask) and development.

Herein, removing the organic film layer overflowing from the groove 1202 may be understood as retaining an organic film layer in the groove 1202 and removing an organic film layer in a region, corresponding to the groove 1202, of the second inter-layer dielectric layer 1262, so that a surface of the organic film layer filled in the groove 1202 is flush with a surface of the second inter-layer dielectric layer 1262. In this way, a flat packaging surface can be obtained, thereby ensuring packaging performance.

The first planarization layer filled in the groove 1202 is the filling layer 15 or the first organic material described above. An elastic modulus of the organic material of the filling layer 15 may range from 2 GPa to 5 GPa, and transmittance of visible light may be 95%±3%.

A material of the first planarization layer 161 may be polyimide, polytetrafluoroethylene, acrylic resin, polyethylene, polyvinyl chloride, polypropylene, phenolic resin, epoxy resin, polybutadiene, polyisoprene, chloroprene rubber, butyl rubber, or the like. A thickness of the first planarization layer 161 may range from 1.5 μm to 2 μm.

Step 2-13: Etch the first planarization layer 161 to form the second hole 1204, where the second hole 1204 extends from a surface of the first planarization layer 161 to the first source/drain portion 1233.

Step 2-14: Form the second source/drain portion 1234 on the first planarization layer 161, where the second source/drain portion 1234 is filled in the second hole 1204 and is in contact with the first source/drain portion 1233.

In this step, the first signal cable portion 181 may also be formed on the second inter-layer dielectric layer 1262. The first signal cable portion 181 is located in the VSS area and may cover the groove 1202 and the filling layer 15 in the groove 1202.

The first signal cable portion 181 and the second source/drain portion 1234 may be fabricated in a same process, that is, fabricated on a same layer. Materials of the first signal cable portion 181 and the second source/drain portion 1234 may be the same.

Step 2-15: Form the second planarization layer 162 on the second source/drain portion 1234, where the second planarization layer 162 covers the second source/drain portion 1234 and extends to the first planarization layer 161. The second planarization layer 162 may also extend to the gate on array 171 and the emission on array 172.

In this step, a third planarization layer 163 may also be formed on the first signal cable portion 181. The third planarization layer 163 may be fabricated in the same process as the second planarization layer 162. Materials of the third planarization layer 163 and the second planarization layer 162 may be the same.

The dam 144 may also be formed in the IJP dam area before or after this step. The dam 144 may be formed on the inter-layer dielectric layer 126 or formed on the first signal cable portion 181.

Figure 17:
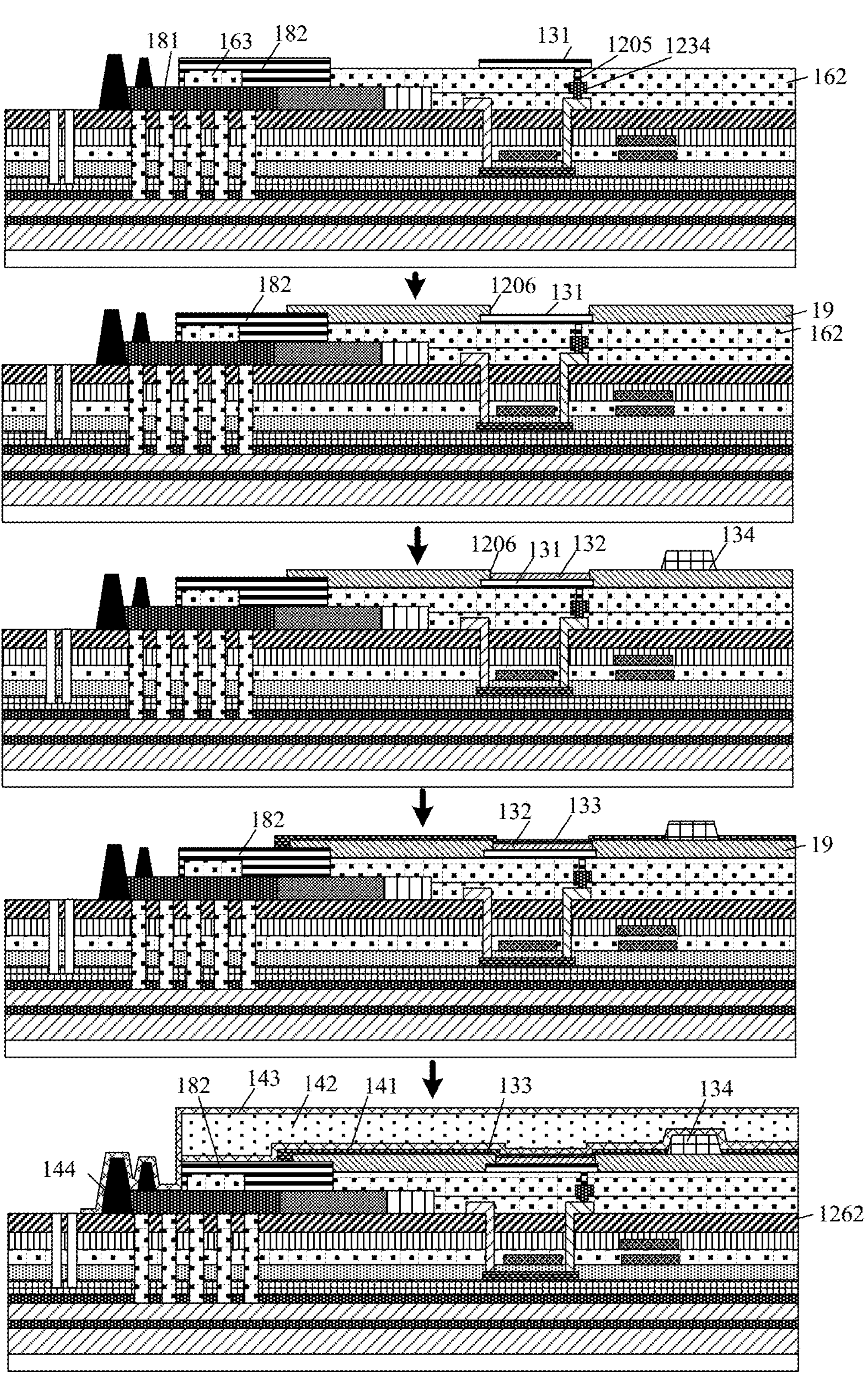

Further reference is made to FIG. 17.

Step 3: Form the light-emitting component layer on the array structure layer.

For example, the anode 131, the pixel definition layer 19, the organic light-emitting layer 132, the pixel spacer layer 134, and the cathode 133 may be sequentially formed on the array structure layer. Specific steps are as follows.

Step 3-1: Etch the second planarization layer 162 to form the third hole 1205, where the third hole 1205 extends from a surface of the second planarization layer 162 to the second source/drain portion 1234.

Step 3-2: Form the anode 131 on the second planarization layer 162, where the anode 131 is filled in the third hole 1205 and is in contact with the second source/drain portion 1234.

For example, a first conductive layer (namely, an anode layer) may be deposited on the second planarization layer 162 by using the sputtering technology. Subsequently, processes including exposure, development, and etching are performed on the first conductive layer to form an anode pattern, that is, the anode 131 is formed.

The first conductive layer may be a composite film layer, for example, an indium tin oxide-argentum-indium tin oxide (ITOAGITO) composite film layer. Thicknesses of film layers in the ITOAGITO composite film layer range from 7 nm to 10 nm, from 90 nm to 100 nm, and from 7 nm to 10 nm, respectively.

It should be understood that a hole transport layer (not shown in the figure) is formed on a surface of the anode 131. Herein, it is considered that the anode 131 includes the anode and the hole transport layer.

In this step, the second signal cable portion 182 may also be formed on the third planarization layer 163, where the second signal cable portion 182 covers the third planarization layer 163 and extends to the first signal cable portion 181. The third planarization layer 163 provides a relatively flat surface for conduction between the first signal cable portion 181 and the second signal cable portion 182, thereby reducing impedance.

Optionally, the second signal cable portion 182 may also extend to the gate on array 171.

Step 3-3: Form the pixel definition layer 19 on the second planarization layer 162, where a region, corresponding to the anode 131, of the pixel definition layer 19 is provided with the opening 1206. The pixel definition layer 19 may extend to the second signal cable portion 182.

For example, the pixel definition layer 19 with the opening 1206 may be formed by applying a first organic film layer on the second planarization layer 162 and exposing and developing the first organic film layer. The opening 1206 disposed on the pixel definition layer 19 is a light-emitting region. The opening 1206 may form a resonant cavity. A side wall of the opening 1206 can reflect light, thereby improving light emitting efficiency.

A thickness of the pixel definition layer 19 may range from 1.5 μm to 2 μm.

In this embodiment of this application, the pixel definition layer 19 may cover an edge portion of the anode 131.

Step 3-4: Form the pixel spacer layer 134 on the pixel definition layer 19.

For example, the pixel spacer layer 134 may be formed by applying a second organic film layer on the pixel definition layer 19 and exposing and developing the second organic film layer. The pixel spacer layer 134 includes a plurality of support pillars. The support pillars are used to support a mask plate for evaporation, such as an FMM, during subsequent evaporation.

A thickness of the pixel spacer layer 134 may range from 2 μm to 2.5 μm.

Step 3-5: Form the organic light-emitting layer 132 on the anode 131, where the organic light-emitting layer 132 is located in the opening 1206 on the pixel definition layer 19.

For example, the organic light-emitting layer 132 may be formed by using an evaporation technology.

A thickness of the organic light-emitting layer 132 may range from 280 nm to 330 nm.

It should be understood that the hole transport layer is also formed between the anode 131 and the organic light-emitting layer 132, where the organic light-emitting layer 132 is formed on the hole transport layer. The electron transport layer is also formed on the organic light-emitting layer 132.

Step 3-6: Form the cathode 133 on the organic light-emitting layer 132 (specifically, the electron transport layer). The cathode 1333 covers the organic light-emitting layer 132 and extends to the pixel definition layer 19 and the second signal cable portion 182.

For example, the cathode 133 may be formed by using the evaporation technology.

A thickness of the cathode 133 may range from 10 nm to 12 nm.

After the cathode 133 is formed, a coupling layer (coupling layer, CPL) and an electromagnetic shielding layer may also be formed on the cathode 133. The coupling layer is an organic layer, and is mainly used to adjust a refractive index and improve light emitting efficiency. The electromagnetic shielding layer is an inorganic layer and mainly plays a role in electromagnetic shielding. A material of the electromagnetic shielding layer may be lithium fluoride (LiF).

Processes of forming the film layers by using the evaporation technology may be collectively referred to as electroluminescent (electro luminescence, EL) evaporation.

Step 4: Form the packaging layer on the light-emitting component layer.

For example, the first chemical vapor deposition layer 141, the ink jet printing layer 142, and the second chemical vapor deposition layer 143 may be sequentially formed on the light-emitting component layer. Specific steps are as follows.

Step 4-1: Form the first chemical vapor deposition layer 141 on the cathode 133, where the first chemical vapor deposition layer 141 covers the cathode 133 and extends to the second signal cable portion 182, the first signal cable portion 181, the dam 144, and the second inter-layer dielectric layer 1262.

For example, the first chemical vapor deposition layer 141 may be deposited by using the PECVD technology or an atomic layer deposition (atomic layer deposition, ALD) technology. A material of the first chemical vapor deposition layer 141 may be $SiO_2$, and a thickness thereof may range from 0.7 μm to 1.2 μm.

Step 4-2: Form the ink jet printing layer 142 on the first chemical vapor deposition layer 141. The ink jet printing layer 142 is disposed on the first chemical vapor deposition layer 141 and located in a region surrounded by the dam 144.

For example, an organic film layer is applied on the first chemical vapor deposition layer 141 and cured, and then the ink jet printing layer 142 is formed. A thickness of the ink jet printing layer 142 may range from 8 μm to 12 μm.

Step 4-3: Form the second chemical vapor deposition layer 143 on the ink jet printing layer 142, where the second chemical vapor deposition layer 143 covers the ink jet printing layer 142 and extends to the first chemical vapor deposition layer 141.

For example, the second chemical vapor deposition layer 143 may be deposited by using the PECVD technology or the ALD technology. A material of the second chemical vapor deposition layer 143 may be SiNx, and a thickness thereof may range from 0.7 μm to 1.2 μm.

At this time, an entire fabrication process of the display panel is completed. Subsequently, the display panel is peeled from the carrier glass, to obtain the display panel shown in FIG. 13.

In this embodiment of this application, while etching is performed on the inter-layer dielectric layer 126 in the display region, the groove 1202 is etched in the region that is of the non-display region (for example, the VSS area) and where the inorganic layer is superimposed; and the organic planarization layer is filled in the groove when the organic planarization layer is applied on the display region. Subsequently, the organic planarization layer in the VSS area is removed by using processes of halftone mask and development. At the same time, an organic matter overflowing from the groove is removed, thereby filling the organic layer with the organic matter. This can alleviate stress concentration of the array structure layer at the position on the edge of the display panel, alleviate a GDS crack on the edge, or prevent a crack from expanding to the display region, thereby alleviating the dark dot problem.

It should be understood that the foregoing only describes the fabrication process of the display panel by taking the structure of the display panel shown in FIG. 13 as an example. A fabrication process of a display panel having another variant structure varies slightly. Those skilled in the art can flexibly design the fabrication process according to the structure of the display panel, which is not limited in this embodiment of this application.

Figure 18:
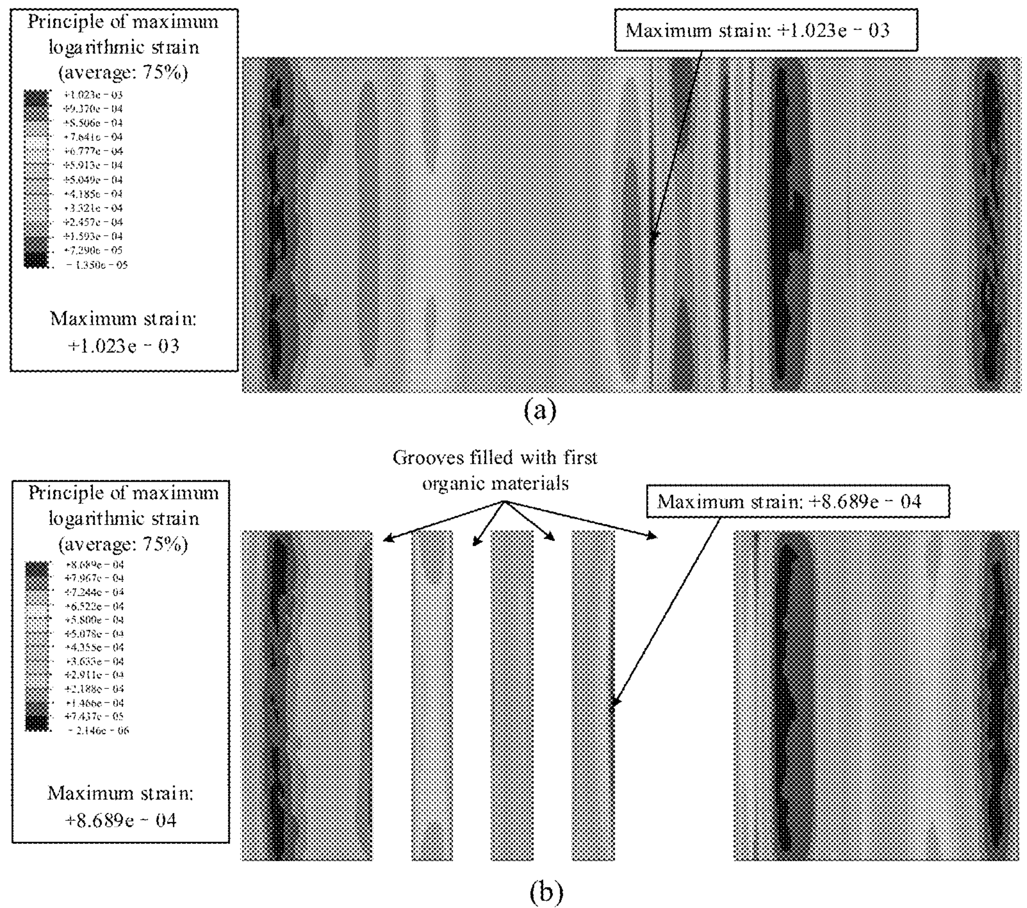
FIG. 18 is a schematic simulation diagram of bending strains of an existing display panel and a display panel according to an embodiment of this application.

FIG. 18 is a schematic simulation diagram of bending strains of an existing display panel and a display panel according to an embodiment of this application. It should be understood that FIG. 18 merely illustrates a schematic simulation diagram of bending strains of array structure layers in a non-display region and in part of a display region.

(a) of FIG. 18 is a schematic simulation diagram of bending strains existing when the array structure layer is provided with no grooves. It can be learned from the figure that a maximum bending strain, in the non-display region, of the array structure layer of the existing display panel is (+1.023e−03) microstrain, namely, 1023 microstrain (unit of microstrain: με.

(b) of FIG. 18 is a schematic simulation diagram of bending strains existing when the array structure layer is provided with grooves. For example, there are three grooves. A width of a groove close to the display region is greater than a width of a groove close to an edge of the display panel. It can be learned from the figure that a maximum bending strain, in the non-display region, of the array structure layer provided with the grooves is (+8.689e−04) microstrain, namely, 869με.

Therefore, bending strain in a region that is of an array structure layer and where an inorganic layer is superimposed can be alleviated through patterning in the region, for example, forming a groove, and then filling the groove with an organic material, for example, the first organic material described above. For example, a bending strain of a display panel in a solution shown in (b) of FIG. 18 can be reduced by about 15%.

Figure 19:
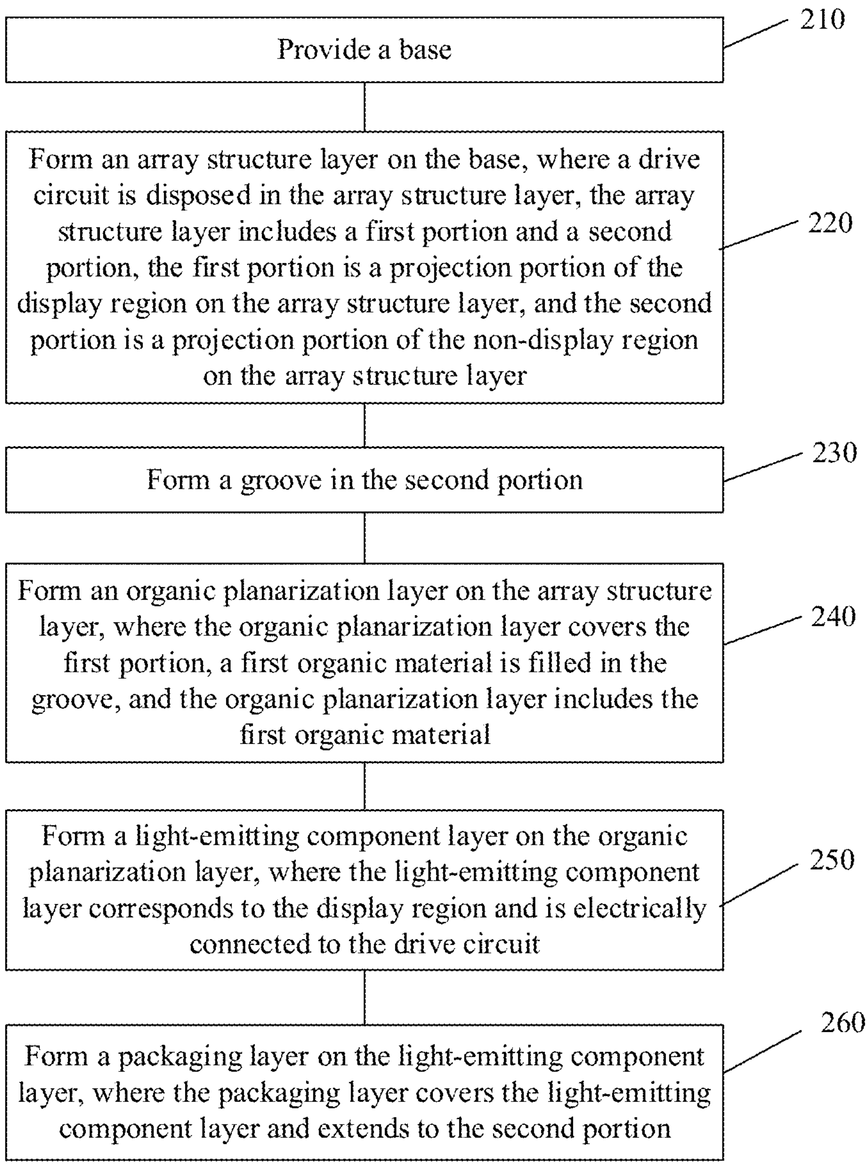
FIG. 19 is a schematic flowchart of a fabrication method of a display panel according to an embodiment of this application.

FIG. 19 shows a schematic flowchart of a fabrication method of a display panel according to an embodiment of this application. The display panel includes a display region and a non-display region extending around the display region. As shown in FIG. 19, the fabrication method includes steps 210 to 260.

210: Provide a base.

The base may be a flexible base, for example, be made of a polyimide PI material. The base may alternatively be a hard base, for example, be made of a glass material.

The base may include one or more substrates. When the base includes a plurality of substrates, the plurality of substrates may be separated by a barrier. The base may be, for example, the base 11 described above.

220: Form an array structure layer on the base.

A drive circuit, for example, a pixel drive circuit or a GOA drive circuit is disposed in the array structure layer. A structure of the drive circuit disposed in the array structure layer may be the structure shown in FIG. 13, or may be another structural form, which is not limited in this embodiment of this application.

The array structure layer includes a first portion and a second portion. The first portion is a projection portion of the display region on the array structure layer. The second portion is a projection portion of the non-display region on the array structure layer. In other words, the first portion corresponds to the display region, and the second portion corresponds to the non-display region. The array structure layer may be the array structure layer 12 described above.

230: Form a groove in the second portion.

A structure of the groove may be a structural form of the groove described in FIG. 8 to FIG. 10. For details, refer to the foregoing descriptions. For brevity, details are not described herein again.

The groove may be etched together with another hole or slot on the array structure layer, or be etched separately, which is not limited in this embodiment of this application. For a manner of etching the groove, reference may be made to a manner of etching the groove 1202 in the display panel shown in FIG. 13. For brevity, details are not described herein again.

In some embodiments, in step 220, an insulation layer, a buffer layer, an active layer, a gate insulation layer, a gate, and an inter-layer dielectric layer may be sequentially formed on the base, where the active layer and the gate are disposed on the first portion of the array structure layer, the gate insulation layer coats the active layer and extends to the buffer layer, and the inter-layer dielectric layer coats the gate and extends to the gate insulation layer. In step 230, the array structure layer may be patterned to form a first hole in the first portion and form the groove in the second portion, where the first hole penetrates the inter-layer dielectric layer and the gate insulation layer and communicates with the active layer, and the groove partially or completely penetrates the inter-layer dielectric layer, the gate insulation layer, the buffer layer, and the insulation layer that are stacked in sequence.

240: Form an organic planarization layer on the array structure layer, where the organic planarization layer covers the first portion of the array structure layer, a first organic material is filled in the groove, and the organic planarization layer includes the first organic material.

In some embodiments, in this step, an organic film may be applied on the array structure layer, where the organic film covers the first portion and the second portion of the array structure layer, and the organic film is filled in the groove. Then, the organic film is patterned, so that the organic film on the second portion of the array structure layer is removed while the organic film filled in the groove is retained, thereby forming the first organic material.

250: Form a light-emitting component layer on the organic planarization layer, where the light-emitting component layer corresponds to the display region and is electrically connected to a drive circuit.

The light-emitting component layer may be the light-emitting component layer 13 described above. For details, refer to the foregoing descriptions. For brevity, details are not described herein again.

260: Form a packaging layer on the light-emitting component layer, where the packaging layer covers the light-emitting component layer and extends to the second portion.

The packaging layer may be the packaging layer 14 described above. For details, refer to the foregoing descriptions. For brevity, details are not described herein again.

In some embodiments, the fabrication method further includes: forming a signal cable layer on the array structure layer, where the signal cable layer is provided with a signal cable on the second portion, and the groove corresponds to a position of the signal cable.

In some embodiments, the signal cable may include a voltage of source series VSS signal cable. The fabrication method of a display panel provided in this embodiment of this application can alleviate stress concentration of the array structure layer at the position on the edge of the display panel, and alleviate a GDS crack on the edge or prevent a crack from expanding to the display region, thereby alleviating the dark dot problem of the display panel.

It should be understood that the fabrication method of a display panel provided in this embodiment of this application imposes no special limitation on a structural form of a display panel. The method is applicable to any display panel that has a relatively thick inorganic layer superimposed on a non-display region. The foregoing embodiments only illustrate some structures of display panels, and should not be understood as limitations to the embodiments of this application.

In the description of this application, it should be noted that, unless expressly specified and defined otherwise, the terms “mount”, “join”, and “connect” should be understood in a broad sense. For example, “connection” may be a fixed connection, a detachable connection, or an integral connection; or may be a mechanical connection or an electrical connection; or may be a direct connection, an indirect connection by means of an intermediate medium, or an internal connection between two elements. Those of ordinary skill in the art should understand the specific meanings of the foregoing terms in this application based on specific situations.

The foregoing descriptions are merely specific embodiments of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display panel, comprising: a display region and a non-display region extending around the display region, wherein the display panel comprises:

a base;

an array structure layer, disposed on the base, wherein a drive circuit is disposed in the array structure layer, the array structure layer comprises a first portion and a second portion, the first portion is a projection portion of the display region on the array structure layer, the second portion is a projection portion of the non-display region on the array structure layer, the second portion is provided with a groove, and the groove is filled with a first organic material;

an organic planarization layer, wherein the organic planarization layer covers the first portion and comprises the first organic material;

a light-emitting component layer, disposed on the organic planarization layer, wherein the light-emitting component layer corresponds to the display region and is electrically connected to the drive circuit; and a packaging layer, wherein the packaging layer covers the light-emitting component layer and extends to the second portion, and the packaging layer covers the groove and the first organic material in the groove, and wherein the second portion comprises an insulation layer, a buffer layer, a gate insulation layer, and an inter-layer dielectric layer that are stacked in sequence, and all of the insulation layer, the buffer layer, the gate insulation layer, and the inter-layer dielectric layer are inorganic film layers, the organic planarization layer is stacked on and in contact with a surface of the inter-layer dielectric layer, an end of the groove is aligned with the surface of the inter-layer dielectric layer, and the first organic material in the groove is surrounded by and in contact with the inter-layer dielectric layer.

2. The display panel according to claim 1, further comprising:

a signal cable layer, disposed on the array structure layer, wherein the signal cable layer is provided with a signal cable on the second portion, and the groove corresponds to a position of the signal cable.

3. The display panel according to claim 2, wherein the signal cable comprises a voltage of source series (VSS) signal cable.

4. The display panel according to claim 1, wherein the groove partially or completely penetrates the array structure layer.

5. The display panel according to claim 1, wherein the gate insulation layer comprises a first gate insulation layer and a second gate insulation layer that are stacked, the organic planarization layer comprises a first planarization layer and a second planarization layer, the first planarization layer comprises the first organic material, the first portion of the array structure layer is provided with a thin-film transistor layer, and the thin-film transistor layer comprises an active layer, a gate, and a source/drain, wherein the active layer is disposed between the buffer layer and the first gate insulation layer, and the first gate insulation layer coats the active layer and extends to the buffer layer;

the gate is disposed between the first gate insulation layer and the second gate insulation layer, the second gate insulation layer coats the gate and extends to the first gate insulation layer, and the gate is disposed opposite the active layer;

the source/drain comprises a first source/drain portion and a second source/drain portion, wherein the first source/drain portion is disposed between the inter-layer dielectric layer and the first planarization layer, the first planarization layer coats the first source/drain portion, the first organic material of the first planarization layer is filled in the groove, and the first source/drain portion is connected to the active layer after sequentially penetrating the inter-layer dielectric layer, the second gate insulation layer, and the first gate insulation layer;

the second source/drain portion is disposed between the first planarization layer and the second planarization layer, the second planarization layer coats the second source/drain portion and extends to the first planarization layer, and the second source/drain portion is connected to the first source/drain portion after penetrating the first planarization layer; and a first signal cable portion is disposed in a region, corresponding to the groove, of the inter-layer dielectric layer, wherein the first signal cable portion is a signal cable fabricated on the same layer as the second source/drain portion, and the first signal cable portion covers the first organic material filled in the groove and the inter-layer dielectric layer around the groove.

6. The display panel according to claim 5, wherein the light-emitting component layer comprises an anode, an organic light-emitting layer, and a cathode that are stacked, wherein the anode is disposed on the second planarization layer, and is connected to the second source/drain portion after penetrating the second planarization layer;

a second signal cable portion is disposed on the first signal cable portion, is connected to the first signal cable portion, and is a signal cable fabricated on the same layer as the anode; and the cathode is disposed on the organic light-emitting layer, covers the organic light-emitting layer, and extends to the second signal cable portion.

7. The display panel according to claim 6, wherein the first signal cable portion and the second signal cable portion are part of a voltage of source series (VSS) signal cable.

8. The display panel according to claim 1, wherein a shape of a section of the groove in a thickness direction of the display panel is any one of the following shapes:

a rectangle, a triangle, a trapezoid, a parallelogram, a polyline, a wave, an ellipse, an arc, or a stair; and/or an extending direction of the groove in a plane where the display panel is located forms any of the following:

a straight line, a curve, or a ring.

9. The display panel according to claim 1, wherein the groove extends in an extending direction along an edge of the first portion, and the groove comprises consecutive trenches in the extending direction or intermittent trenches in the extending direction.

10. The display panel according to claim 1, wherein an average width of the groove ranges from 15 microns to 25 microns.

11. The display panel according to claim 1, wherein the groove comprises a plurality of parallel trenches, and the plurality of parallel trenches extend along an edge of the first portion, wherein a distance between two adjacent trenches in the plurality of parallel trenches ranges from 20 microns to 25 microns.

12. The display panel according to claim 11, wherein a width of a trench in the plurality of parallel trenches that is close to the edge of the first portion is greater than or equal to a width of a trench in the plurality of parallel trenches that is close to an edge of the display panel.

13. The display panel according to claim 1, wherein a shortest distance between the groove and an edge of the display panel ranges from 200 microns to 250 microns.

14. The display panel according to claim 1, wherein the base is made of a flexible material.

15. A display apparatus, comprising the display panel according to claim 1.

16. The display panel according to claim 1, wherein the first organic material in the groove is in contact with the base.

17. A fabrication method of a display panel, wherein the display panel comprises a display region and a non-display region extending around the display region, and the fabrication method comprises:

providing a base;

forming an array structure layer on the base, wherein a drive circuit is disposed in the array structure layer, the array structure layer comprises a first portion and a second portion, the first portion is a projection portion of the display region on the array structure layer, and the second portion is a projection portion of the non-display region on the array structure layer;

forming a groove in the second portion;

forming an organic planarization layer on the array structure layer, wherein the organic planarization layer covers the first portion and further comprises a first organic material, and the first organic material is filled in the groove;

wherein forming the array structure layer comprises sequentially forming an insulation layer, a buffer layer, an active layer, a gate insulation layer, a gate, and an inter-layer dielectric layer on the base, wherein the organic planarization layer is stacked on and in contact with a surface of the inter-layer dielectric layer, an end of the groove is aligned with the surface of the inter-layer dielectric layer, and the first organic material in the groove is surrounded by and in contact with the inter-layer dielectric layer;

forming a light-emitting component layer on the organic planarization layer, wherein the light-emitting component layer corresponds to the display region and is electrically connected to the drive circuit; and forming a packaging layer on the light-emitting component layer, wherein the packaging layer covers the light-emitting component layer and extends to the second portion, and the packaging layer covers the groove and the first organic material in the groove.

18. The fabrication method according to claim 17, wherein the fabrication method further comprises:

forming a signal cable layer on the array structure layer, wherein the signal cable layer is provided with a signal cable on the second portion, and the groove corresponds to a position of the signal cable.

19. The fabrication method according to claim 17, wherein:

the active layer and the gate are disposed on the first portion, the gate insulation layer coats the active layer and extends to the buffer layer, and the inter-layer dielectric layer coats the gate and extends to the gate insulation layer; and the forming a groove in the second portion comprises:

patterning the array structure layer to form a first hole in the first portion and form the groove in the second portion, wherein the first hole penetrates the inter-layer dielectric layer and the gate insulation layer and communicates with the active layer, and the groove partially or completely penetrates the inter-layer dielectric layer, the gate insulation layer, the buffer layer, and the insulation layer that are stacked in sequence.

20. The fabrication method according to claim 17, wherein the forming an organic planarization layer on the array structure layer comprises:

applying an organic film on the array structure layer, wherein the organic film covers the first portion and the second portion, and is filled in the groove; and patterning the organic film to remove the organic film on the second portion of the array structure layer and retain the organic film filled in the groove.

* * * * *